United States Patent
Jang et al.

(10) Patent No.: US 7,400,541 B2
(45) Date of Patent: Jul. 15, 2008

(54) CIRCUITS AND METHODS FOR DATA BUS INVERSION IN A SEMICONDUCTOR MEMORY

(75) Inventors: Seong-Jin Jang, Gyeonggi-do (KR); Jeong-Don Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/863,604

(22) Filed: Sep. 28, 2007

(65) Prior Publication Data

US 2008/0019451 A1    Jan. 24, 2008

Related U.S. Application Data

(63) Continuation of application No. 11/369,341, filed on Mar. 7, 2006, now Pat. No. 7,280,412.

(30) Foreign Application Priority Data

Nov. 21, 2005    (KR) .............................. 2005-111214

(51) Int. Cl.
*G11C 7/06* (2006.01)

(52) U.S. Cl. ............................ 365/189.07; 365/189.06; 365/206; 326/26; 710/105; 710/305; 713/320

(58) Field of Classification Search ............ 365/189.07, 365/189.06, 206; 326/26; 710/105, 305; 713/320
See application file for complete search history.

(56) References Cited

U.S. PATENT DOCUMENTS

| 4,988,893 | A  | 1/1991  | Bonneau et al. ............. 307/279 |
| 5,874,833 | A  | 2/1999  | Perry et al. .................... 326/26 |
| 6,072,329 | A  | 6/2000  | Schenck ....................... 326/26 |
| 6,243,779 | B1 | 6/2001  | Devanney et al. ........... 710/305 |
| 6,314,039 | B1 | 11/2001 | Hill et al. ..................... 365/207 |
| 2002/0156953 | A1 | 10/2002 | Beiley et al. ................ 710/105 |

*Primary Examiner*—Richard T. Elms
*Assistant Examiner*—Eric Wendler
(74) *Attorney, Agent, or Firm*—Myers Bigel Sibley & Sajovec, PA

(57) ABSTRACT

A data bus inversion (DBI) circuit includes at least one DBI block configured to invert an input data signal based on the logic state of input data bits. The DBI block includes a comparison deciding unit configured to generate, in a first mode, a comparison signal based on the number of changed bits by comparing respective bit signals of the input data signal and a previous input data signal. The comparison deciding unit generates an inversion control signal which controls whether the input data will be inverted or not. In a second mode, the comparison deciding unit generates an inversion control signal based on the predominant logic state of the input data signal bits. A data converting unit is configured to invert the input data signal in response to the inversion control signal. Method embodiments are also disclosed.

25 Claims, 11 Drawing Sheets

CIRCUITS AND METHODS FOR DATA BUS INVERSION IN A SEMICONDUCTOR MEMORY

CROSS-REFERENCE TO RELATED APPLICATIONS

This application is a continuation of U.S. patent application Ser. No. 11/369,341, filed on Mar. 7, 2006, now U.S. Pat. No. 7,280,412, which claims priority from Korean Patent Application Ser. No. 2005-111214, filed on Nov. 21, 2005, the disclosures of both of which are incorporated herein by reference in their entirety.

FIELD OF THE INVENTION

The present invention relates to semiconductor memory devices, and more particularly, to a data bus inversion (DBI) circuit and associated methods, which are capable of converting and outputting data, so as to reduce power consumption and/or signal noise in semiconductor memory operations.

BACKGROUND

In general, semiconductor memory devices are becoming increasingly highly-integrated and operating at increasingly higher clock speeds. In order to accomplish this, it may be desirable to substantially reduce power consumption and/or signal noise in the memory device. In particular, in a data "read" operation, it may be desirable for such devices to operate with low power consumption and/or low signal noise.

FIG. 1 is a block diagram illustrating a data read path in a conventional semiconductor memory device. Referring to FIG. 1, a data read path includes a memory cell 10, a bit line sense amplifier 20, an input/output sense amplifier 30, a data output buffer circuit 40 and a pad 50. The data output buffer circuit 40 may include a data output driver circuit.

In a data read operation, data stored in a memory cell 10 is provided on a bit line, where it is sensed and amplified in a bit line sense amplifier 20. The data is amplified in an input/output sense amplifier 30 through a global line, e.g., a global bit line and/or a global input/output line. Data amplified in the input/output sense amplifier 30 is converted into a signal having the appropriate configuration of bits. The data is output to the pad 50 through the output buffer circuit 40. Thus, the data stored in the memory cell 10 is output through several circuits, each of which may impart noise to the signal and/or may consume electric power.

In the circuits forming the read path of a semiconductor memory device, and in particular when data read from a memory cell is output to an external circuit through a data output buffer circuit, signal noise and/or power consumption may be relatively large. That is, it is known that the signal noise and/or power consumption may be relatively large in a data output buffer circuit including an output driver circuit.

For this reason, a transistor used as an output terminal, e.g., an output driver circuit, of the data output buffer circuit may have a considerably large channel width relative to other components of the chip, so as to provide impedance isolation between the chip exterior and interior, and/or to facilitate high speed data access. When the transistor constituting an output terminal of a data output buffer performs a given output operation, such as a swing operation that is performed from a 'high' level to a "low" level or from a "low" level to a "high" level, a large current may flow momentarily, which may be a source of additional signal noise.

As one solution for this problem, the concept of a data bus inversion (DBI) device or circuit was introduced. A data bus inversion circuit may be useful for providing reliable, high-speed data transmission between chips.

FIG. 2 is a block diagram of a conventional data bus inversion circuit. As shown in FIG. 2, a data bus inversion (DBI) circuit 80 may be provided within a semiconductor memory device ahead of a data output buffer circuit, so as to reduce power consumption and/or signal noise in the data output buffer circuit. The data bus inversion circuit 80 inverts, or does not invert, and outputs an input data signal Din. An inverted, or non-inverted, output data signal Dout output from the data bus inversion circuit 80 is provided to the outside through a data output buffer circuit.

An example of a data bus inversion circuit is disclosed in United States Pre-grant Publication No. 2004/0068594.

Such a data bus inversion circuit was known merely conceptually to those skilled in the art, and concrete technical realizations or exemplary embodiments were not well known. Thus, there may be problems in realizing semiconductor memory devices from the viewpoint of putting them to practical use for reducing power consumption and/or signal noise.

SUMMARY

Some embodiments of the present invention provide data bus inversion circuits and/or data bus inversion methods for use in a semiconductor memory device.

In particular, some embodiments of the present invention provide data bus inversion circuits and/or a data bus inversion methods for a semiconductor memory device which have an AC and/or a DC mode of operation, and which may be switched between the AC mode and the DC mode of operation.

According to some embodiments of the invention, a data bus inversion circuit for use in a semiconductor memory device includes at least one data bus inversion block configured to selectively invert an input data signal based on a bit logic state of serial bit signals of an input data signal. The data bus inversion block includes a comparison deciding unit configured to compare, in a first mode, a first comparison signal based on the number of changed logic bits that is obtained by comparing respective bit signals for the input data signal and a previous input data signal that was input just before the input data signal, with inversion information of the previous input data signal. The data buse inversion block is further configured to generate a first inversion control signal indicating whether to invert the input data signal, and to generate, in a second mode, a second inversion control signal based on a predominant bit logic state of the input data signal. The data bus inversion block further includes a data converting unit configured to invert, or not invert, the input data signal in response to the first or second inversion control signal, and to output the data signal.

The comparison deciding unit includes a data comparing part configured to compare, in a first mode, respective bit signals of the input data signal and the previous input data signal, and to define the number of changed logic bits and unchanged logic bits of the input data signal, and to generate a first comparison signal obtained by comparing the number of changed logic bits and unchanged logic bits. The data comparing part is further configured to compare, in a second mode, the number of bits having a first logic state with the number of bits having a second logic state, for bit signals of the input data signal, and to output a second comparison signal.

The comparison deciding unit further includes an inversion deciding part configured to receive and compare, in a first mode, the first comparison signal output from the data comparing part and the inversion information of the previous input data signal, and to decide whether to invert the input data signal, and to output a first inversion control signal indicative of whether the input data signal is to be inverted. The inversion deciding part is further configured to output, in a second mode, the second comparison signal as a second inversion control signal in the same logic state. The data comparing part may include a first comparator that has a plurality of XNOR circuits, which correspond to the respective bit signals of the input data signal. Each XNOR circuit may have one bit signal of the input data signal as a first input and one bit signal of a corresponding previous input data signal as a second input.

The data comparing part may further include a differential amplifier circuit, in which, in a first mode, output signals of the first comparator are input in parallel to a first input terminal, and inversion signals of respective output signals of the first comparator are input in parallel to a second input terminal, and, in a second mode, bit signals of the input data signal are input in parallel to a first input terminal, and inversion signals for each of the bit signals of the input data signal are input in parallel to a second input terminal. The first mode may be an AC mode, and the second mode may be a DC mode. The inversion deciding part may include an XNOR circuit that has a first comparison signal of the data comparing part as a first input and inversion information of the previous input data signal as a second input, and that outputs a first inversion control signal for the input data signal.

The data converting unit may include buffer circuits to which bit signals of the input data signal are input respectively, a first switching circuit configured to switch the buffer circuits in response to the first or second inversion control signal, inverter circuits to which bit signals of the input data signal are individually input, and a second switching circuit configured to switch the inverter circuits in response to the first or second inversion control signal.

The data bus inversion circuit may further include a latch configured to latch the first or second inversion control signal such that the inversion control signal is not provided to the data converting unit until a latch signal is received. The data bus inversion circuit may further include a switching circuit configured to switching to a first mode or a second mode.

According to further embodiments of the invention, a data bus inversion circuit is configured to selectively invert, or not invert, and output an input data signal based on the bit logic state of bit signals of an input data signal. The data bus inversion circuit includes a data comparing unit configured to compare the input data signal and a previous input data signal, on a bit-by-bit basis, and to define a changed logic bit number and unchanged logic bit number of the input data signal, and to output an AC comparison signal by comparing the changed logic bit number with the unchanged logic bit number. The data bus inversion circuit further includes an inversion deciding unit configured to receive the AC comparison signal output from the data comparing unit and information as to whether the previous input data signal is inverted or not, and to decide whether to invert the input data signal, and to output an AC inversion control signal to indicate whether to invert the input data signal. A data converting unit is configured to invert or not invert a corresponding data signal in response to the AC inversion control signal output from the inversion deciding unit, and to output the data signal.

The data comparing unit may include a first comparator and a second comparator.

The first comparator may have a plurality of XNOR circuits which individually correspond to respective bit signals of the input data signal, and may define a changed logic bit number and unchanged logic bit number of the input data signal, the XNOR circuit having one bit signal of the input data signal as a first input and one bit signal of corresponding previous input data signal as a second input.

The second comparator includes a differential amplifier circuit and outputs an AC comparison signal by comparing the changed logic bit number and the unchanged logic bit number. The differential amplifier circuit has a first input terminal to which output signals of respective XNOR circuits constituting the first comparator are input in parallel, and a second input terminal to which inversion signals of respective output signals of the respective XNOR circuits constituting the first comparator are input in parallel.

The inversion deciding unit may include an XNOR circuit that receives an AC comparison signal of the data comparing unit as a first input, and an information signal to check whether a previous input data signal was inverted, as a second input, and that outputs an AC inversion control signal for the input data signal.

The data converting unit may include buffer circuits to which bit signals of the input data signal are input respectively, a first switching circuit configured to switch the buffer circuits in response to the AC inversion control signal, inverter circuits to which bit signals of the input data signal are individually input, and a second switching circuit configured to switch the inverter circuits in response to the AC inversion control signal.

The data bus inversion circuit may further include a latch configured to latch the AC inversion control signal output from the inversion deciding unit until a latch signal is received.

According to still further embodiments of the invention, a data bus inversion method is provided for selectively inverting an input data signal in conformity with a bit logic state of an input data signal that is constructed of serial bit signals. The method may include comparing an AC comparison signal with inversion information of a previous input data signal, and generating an AC inversion control signal to decide whether the input data signal is inverted or not, the AC comparison signal being based on the number of changed logic bits that is obtained by comparing respective bit signals of the input data signal and the previous input data signal input just before the input data signal; and inverting, or not inverting, the input data signal in response to the AC inversion control signal.

Generating the AC inversion control signal includes comparing the input data signal and the previous input data signal, on a bit-by-bit basis, and defining and comparing the number of changed logic bits and unchanged logic bits of the input data signal, and receiving and comparing the AC comparison signal and inversion information of the previous input data signal, and so deciding as to whether the input data signal is inverted, and outputting an AC inversion control signal indicating whether the input data signal is to be inverted or not. Generating the AC inversion control signal may further include latching the AC inversion control signal and delaying an inversion or non-inversion of the corresponding data signal until a latch signal is received, after the outputting of the AC inversion control signal.

According to further embodiments of the present invention, a data bus inversion method for selectively inverting an input data signal in conformity with a bit logic state of input data signal that is constructed of serial bit signals includes defining the number of bits having a first logic state and the number of bits having a second logic state, for bit signals of input data signal, and outputting a DC inversion control signal based on a predominant bit logic state; and inverting or not inverting and outputting the data signal in response to the DC inversion control signal.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
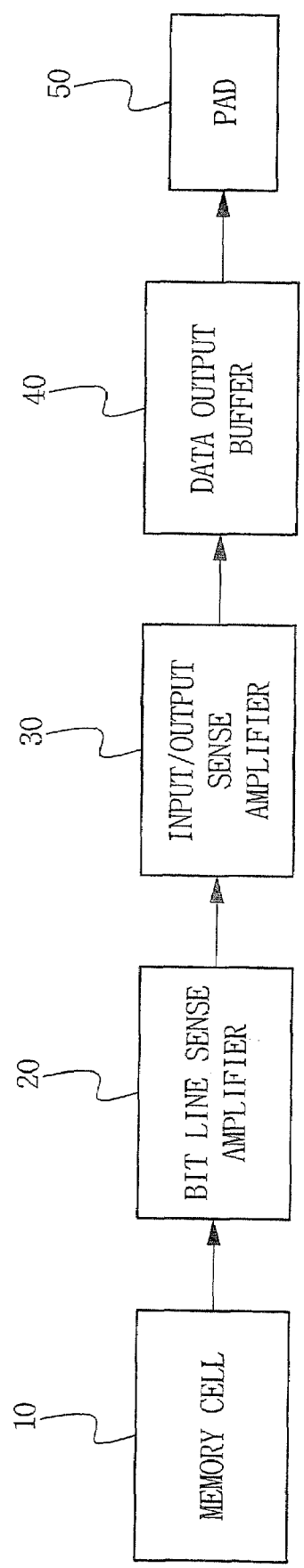
FIG. 1 is a block diagram illustrating a data read path in a conventional semiconductor memory device.
Figure 2:
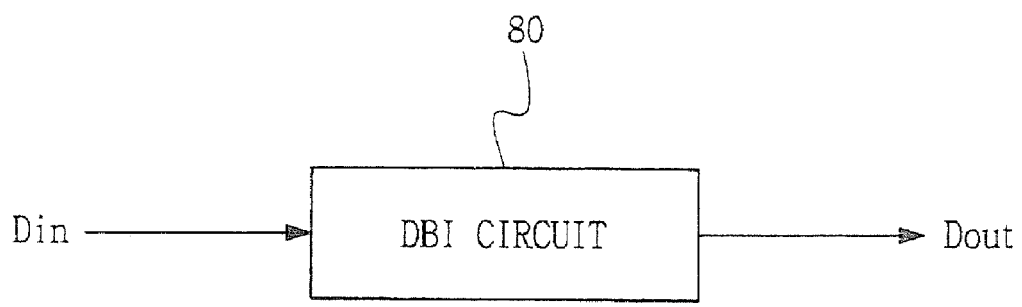
FIG. 2 is a block diagram of conventional data bus inversion circuit.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. Furthermore, a data signal may be termed "current data signal" to distinguish it from a previous data signal and/or a subsequent data signal. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 3 to 12. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

In the following description, a "data signal" is a digital signal that includes a plurality of serial bit signals, each of which may have either of a first or a second logic state. For example, a data signal may include n+1 bit signals (0, 1, . . . , n), each of which may have a first logic state or a second logic state. The first logic state may be, for example, "1", "high", "on", etc., while the second logic state may be, for example, "0", "low", "off", etc., and vice-versa.

Figure 3:
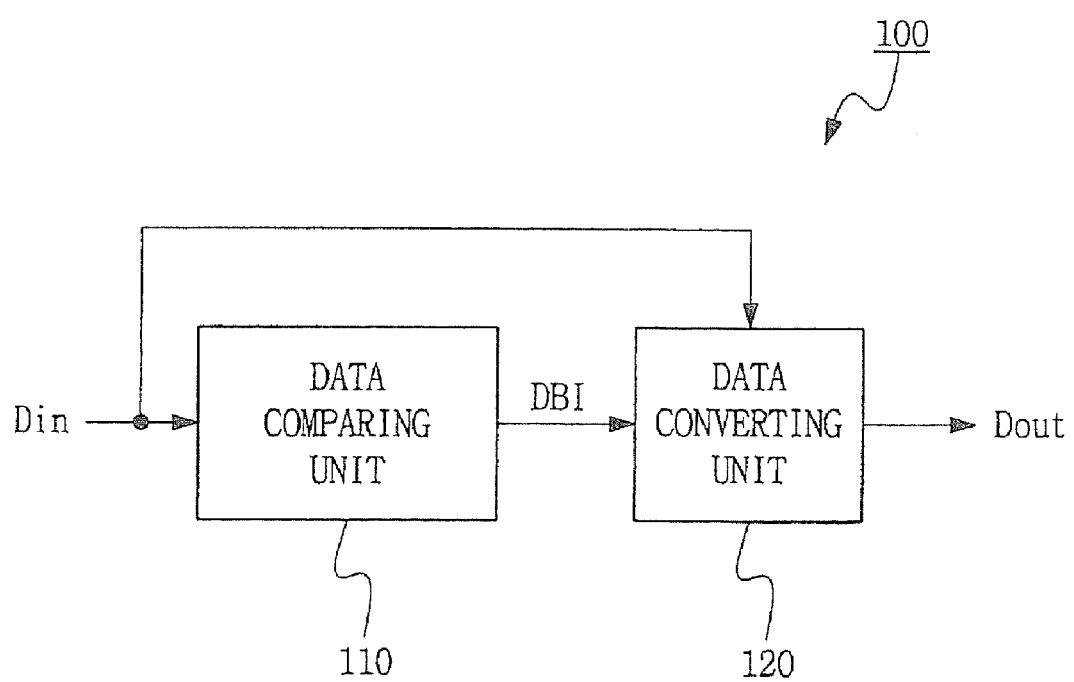
FIG. 3 is a block diagram of a data bus inversion circuit according to some embodiments of the invention.

FIG. 3 is a block diagram of data bus inversion circuit according to some embodiments of the invention.

Referring to FIG. 3, a data bus inversion circuit 100 configured to operate in a DC mode includes a data comparing unit 110 and a data converting unit 120. In the DC mode, the data bus inversion circuit 100 may decide whether a data signal is to be inverted or not, by comparing a plurality of bit signals of the input data signal Din.

The data comparing unit 110 outputs a DC inversion control signal DBI based on a comparison of the number of bits in the input data signal having a first logic state with the number of bits in the input data signal having the second logic state.

For example, if the number of bit signals of an input data signal Din having a first logic state is more than the number of bit signals of the input data signal Din having the second logic state, a DC inversion control signal DBI, which determines whether the input data is to be inverted or not, is output as a logic 'low' level. If the number of bit signals of the input data signal Din having the first logic state is less than or equal to the number of bit signals having the second logic state, the DC inversion control signal DBI is output as a logic 'high' level. The first logic state may correspond to a data '0' state and the second logic state may correspond to a data '1' state, or vice-versa.

The data converting unit 120 inverts, or does not invert, the input data signal Din in response to the DC inversion control signal DBI, and outputs the data as an output data signal Dout.

For example, when the DC inversion control signal DBI output from the data comparing unit 110 has a logic 'high' level, the data converting unit 120 outputs the input data state intact, i.e., in a non-inverted state. However, when the DC inversion control signal DBI output from the data comparing unit 110 has a logic 'low' level, the data converting unit 120 inverts all of the respective bit signals of the input data signal and outputs them.

Data (whether inverted or non-inverted) that is output from the data converting unit 120 may be input, for example, to an output buffer circuit in a semiconductor memory device and/or to an output driver circuit.

Such a data bus inversion circuit operating in a DC mode as described above according to some embodiments of the invention may be useful in a semiconductor memory device having an open drain-type output driver circuit. In an open drain-type output driver circuit, generally, consumption current may be different depending on the output state of the data. That is, it is known that the amount of current consumed in outputting data having a '1' state is smaller than amount of current consumed in outputting data having a '0' state.

Thus, a semiconductor memory device including an open drain-type output driver circuit can substantially reduce power consumption by providing a data inversion circuit operating in a DC mode, which may help provide that an output data signal has a larger number of ones than zeros as bit signals. In other words, the number of bits in an input data signal having a data '1' and the number of bits having a data '0' are determined, and if the number of bits having a data '1' state is more than the number of bits having a data '0' state, the input data is not inverted prior to being output. If the number of bits having a data '1' state is less than the number of bits having a data '0' state, the input data is inverted and the inverted signal is output, thereby potentially allowing a reduction in power consumption in the semiconductor memory device.

Figure 4:
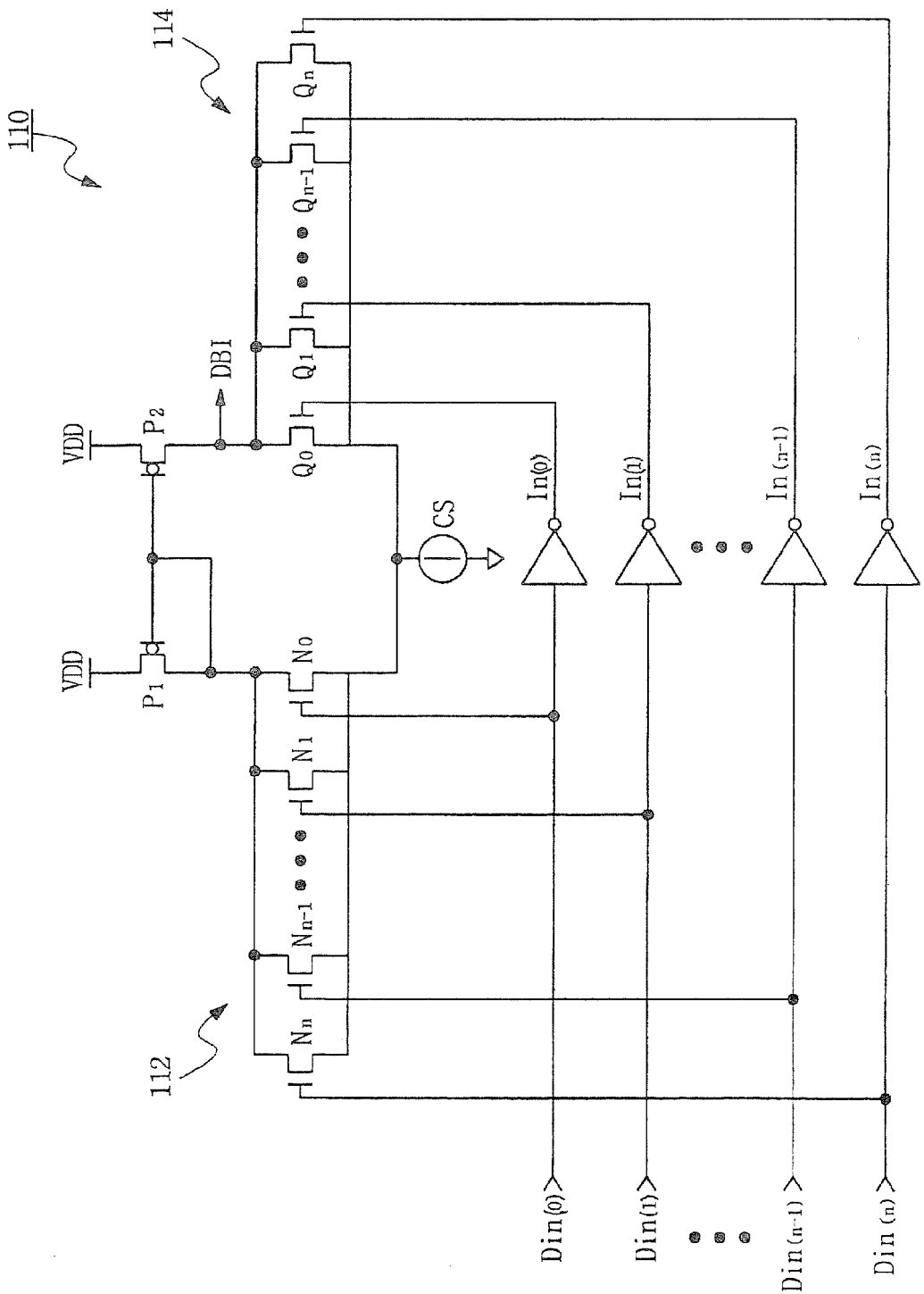
FIG. 4 is a circuit diagram of the data comparing unit shown in FIG. 3.

FIG. 4 illustrates a data comparing unit 110 according to some embodiments of the invention.

As shown in FIG. 4, the data comparing unit 110 may be realized, for example, as a differential amplifier circuit. The data comparing unit 110 shown in FIG. 4 has a current mirror configuration. However, the data comparing unit 110 may be realized using any of several kinds of cross coupled differential amplifiers and/or various kinds of differential amplifier circuits, or other equivalent circuits.

The data comparing unit 110 includes n+1 NMOS transistors N0 to Nn connected in parallel to configure a first input terminal 112 and n+1 NMOS transistors Q0 to Qn connected in parallel to configure a second input terminal 114. The data comparing unit 110 further includes two PMOS transistors P1 and P2 connected in a current mirror configuration. Inverters In(0) to In(n) are connected between the signal inputs Din(0) to Din(n) for n+1 bit inputs of the input signal and gates of respective ones of the n+1 NMOS transistors Q0 to Qn. A current source is connected to the transistors N0 to Nn and Q0 to Qn as shown in FIG. 4. Bit signals Din(0) to Din(n) of the input data signal Din are individually input to each gate of NMOS transistors N0 to Nn constituting the first input terminal 112. Inverted bit signals obtained by inverting the respective bit signals Din(0) to Din(n) of input data signal Din through inverters In(0) to In(n) are individually input to each gate of NMOS transistors Q0 to Qn constituting the second input terminal 114.

It is assumed herein that the NMOS transistors N0 to Nn connected in parallel to form the first input terminal, and the NMOS transistors Q0 to Qn connected in parallel to form the second input terminal, are turned on when bit signals of the input data have a second logic state (e.g. a data '1' state), and are turned off when the bit signals have a first logic state (e.g. a data '0' state).

First, when more of the bit signals Din(0) to Din(n) of the input data signal Din have the first logic state (i.e. the data '0' state) than the second logic state (i.e. the data '1' state), the data comparing unit 110 operates as follows.

When more of the bit signals Din(0) to Din(n) of the input data signal Din have the data '0' state than the data '1' state, the number of transistors turned on and then operating from transistors N0 to Nn of the first input terminal 112 is less than the number of transistors turned on and then operating from transistors Q0 to Qn of the second input terminal 114. Thus, current flowing in a first input terminal 112 is less than current flowing in a second input terminal 114. In this case, a DC inversion control signal DBI, which is provided as an output signal of the data comparing unit 110, has a logic 'low' level due to the operation of the current mirror type differential amplifier.

However, when more of the bit signals Din(0) to Din(n) of the input data signal Din have the second logic state (i.e. the data '1' state) than the first logic state (i.e. the data '0' state), the data comparing unit 110 operates as follows.

When more of the bit signals Din(0) to Din(n) of the input data signal Din have the data '1' state than the data '0' state, the number of transistors turned on and then operating from transistors N0 to Nn of the first input terminal 112 is more than the number of transistors turned on and then operating from transistors Q0 to Qn of the second input terminal 114. Thus the amount of current flowing in a first input terminal is more than current flowing in a second input terminal. Also, a DC inversion control signal DBI, which is provided as an output signal of the data comparing unit 110, has a logic 'high' level due to the operation of the current mirror type differential amplifier.

When the same number of bit signals Din(0) to Din(n) of the input data signal Din have the first and second logic states, the DC inversion control signal DBI has a logic 'high' level.

In realizing the data comparing unit 110 using the differential amplifier circuit as described above, the number of bits of an input signal Din having a first logic state is compared with the number of bits of the input signal Din having a second logic state, and a corresponding DC inversion control signal DBI is output.

Figure 5:
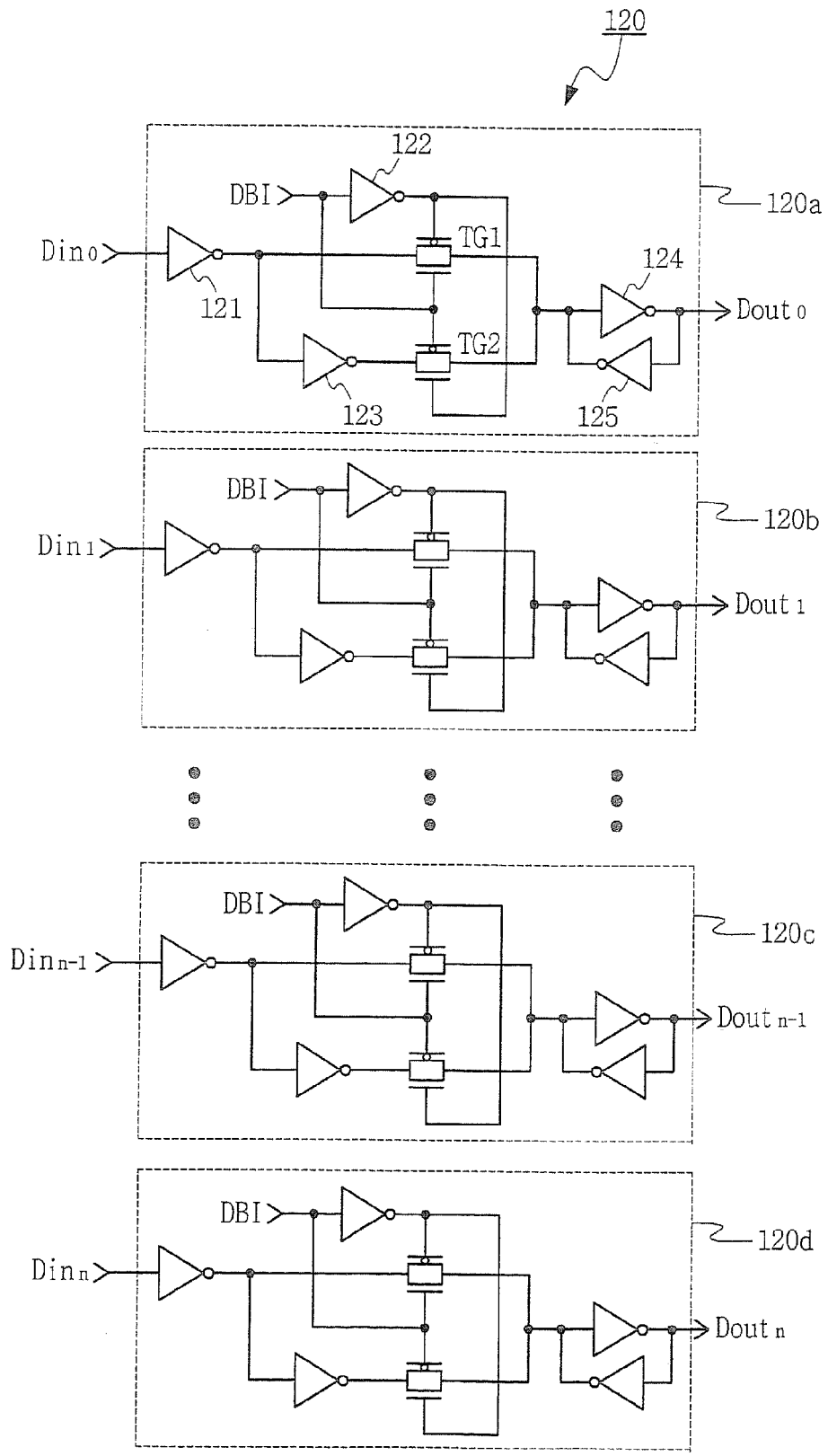
FIG. 5 is a circuit diagram of the data converting unit shown in FIG. 3.

FIG. 5 illustrates an exemplary embodiment of the data converting unit 120 shown in FIG. 3.

Referring to FIG. 5, the data converting unit 120 includes a first converting block 120a through an (n+1)th converting block 120d. The data converting unit 120 inverts, or does not invert, respective bit signals Din (0) to Din (n) through first to (n+1)th converting blocks 120a to 120d to which the bit signals Din(0) to Din(n) are individually provided as the input data signal Din, then outputs the inverted or non-inverted bit signals. The DC inversion control signal DBI, which is input to each of the converting blocks 120a to 120d, determines whether or not the respective bit signals Din(0) to Din(n) will be inverted. For example, when the DC inversion control signal DBI has a logic 'high' level, all of the bit signals Din(0) to Din(n) of the input data signal Din are not inverted by the respective converting blocks 120a, 120b, 120c, 120d, and are output as output data signals Dout(0) to Dout(n). When the DC inversion control signal DBI has a logic 'low' level, all of the bit signals Din(0) to Din(n) are inverted by the respective converting blocks 120a to 120d. The inverted bit signals are then output as output data signals Dout(0) to Dout(n).

The respective converting blocks 120a to 120d of the data converting unit 120 may have the same circuit structure as shown in FIG. 5. The circuit structure of the converting blocks 120a to 120d will be described with an example of first converting block 120a as one of the respective converting blocks, as follows. The first converting block 120a includes inverters 121, 122, 123, 124 and 125, and transmission gates TG1 and TG2, connected in a configuration as shown in FIG. 5. The first converting block 120a controls the transmission gates TG1 and TG2 in response to a DC inversion control signal DBI output from the data comparing unit 110. When the DC inversion control signal DBI has a logic 'high' level, the transmission gate TG1 is turned on, and the transmission gate TG2 is turned off, and then data bit signal Din(0) of the input data signal Din is not inverted and is output as output data signal Dout(0). For example, when the input data bit signal Din(0) has a first logic state, an output data bit signal Dout(0) is also output as a first logic state. When the input data bit signal Din(0) has a second logic state, the output data bit signal Dout(0) is also output as a second logic state. When the DC inversion control signal DBI has a logic 'low' level, the transmission gate TG1 is turned off, and the transmission gate TG2 is turned on. Then the data bit signal Din(0) of the input data is inverted and the inverted signal is output as Dout(0). For example, when the input data bit signal Din(0) has a first logic state, an output data bit signal Dout(0) having a second logic state is output. When the input data bit signal Din(0) has a second logic state, an output data bit signal Dout(0) having the first logic state is output.

Similar operations are performed in the respective converting blocks 120a to 120d of the data converting unit 120.

In some embodiments, each converting block 120a to 120d may include an XNOR circuit that has the DC inversion control signal DBI as a first input and any one bit signal of respective bit signals Din(0) to Din(n) of input data, as a second input, and that performs a logical operation and outputs it.

Figure 6:
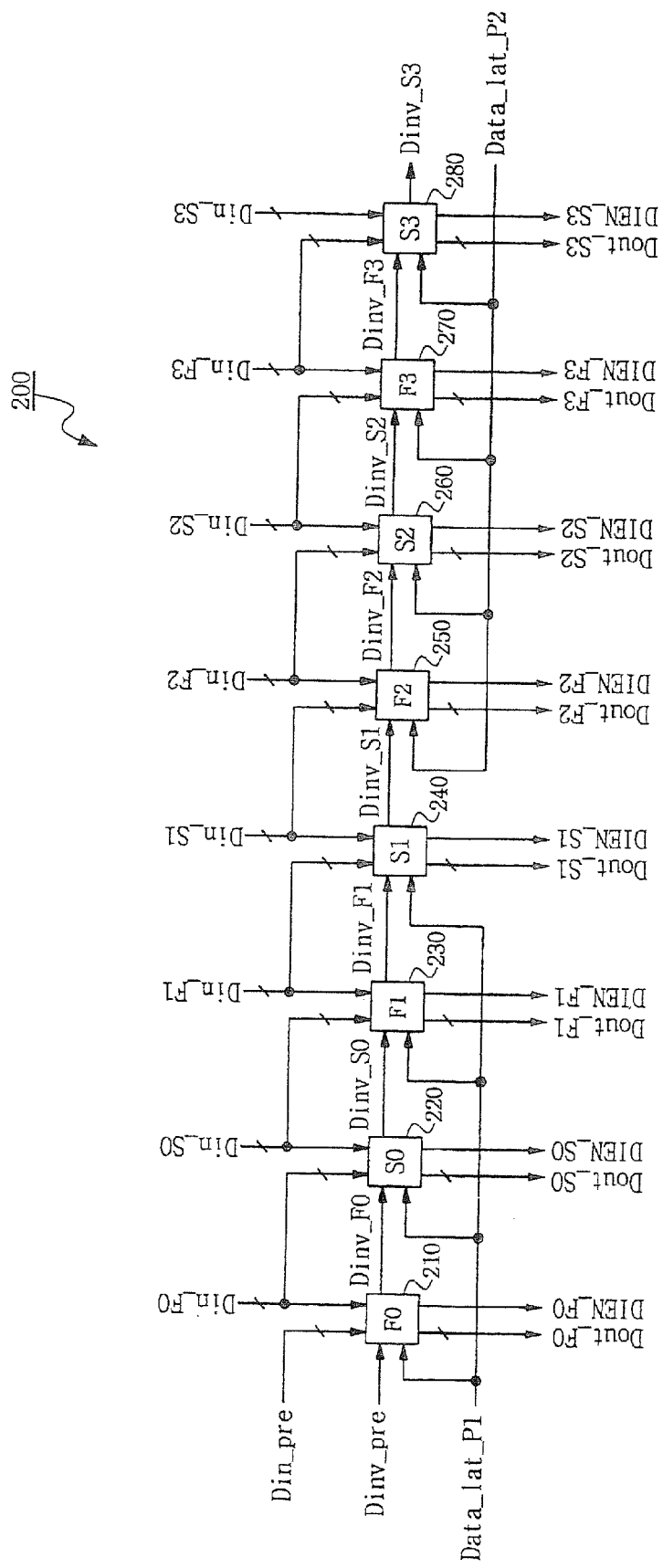
FIG. 6 is a block diagram of a data bus inversion circuit according to further embodiments of the invention.

FIG. 6 is a block diagram of data bus inversion circuit according to further embodiments of the invention.

With reference to FIG. 6, a data bus inversion circuit 200 according to some embodiments may operate in an AC mode. An AC mode data bus inversion circuit 200 may include a plurality of data bus inversion blocks 210, 220, 230, 240, 250, 260, 270 and 280. In the AC mode, bit signals of one data signal are compared with bit signals of another data signal when the two data signals are input, and a decision is made whether to invert or not to invert the data signals.

The number of data bus inversion blocks 210, 220, 230, 240, 250, 260, 270 and 280 may correspond to the number of data signals that are input. The data bus inversion blocks 210 to 280 may each have the same internal circuit configuration; however, the input signals and the output signals are different for each of the blocks. The data bus inversion circuit 200 of FIG. 6 may be used in a semiconductor memory device in which eight data signals are continuously input or output, and the data bus inversion circuit 200 is configured to include eight data bus inversion blocks 210, 220, 230, 240, 250, 260, 270 and 280.

Operations of the data bus inversion blocks 210, 220, 230, 240, 250, 260, 270 and 280 will be described as follows. It is first assumed that a first input data signal to an eighth input data signal Din_F0, Din_S0, Din_F1, Din_S1, Din_F2, Din_S2, Din_F3 and Din_S3 are input to the data bus inversion blocks 210, 220, 230, 240, 250, 260, 270 and 280, respectively.

When a first input data signal Din_F0 is input, a first data bus inversion block 210 operates. The first data bus inversion block 210 compares the first input data signal Din_F0 with a previous input data signal Din_pre, receives an information signal Dinv_pre indicating whether the previous input data signal was inverted or not, and decides whether the first input data signal Din_F0 is to be inverted or not. The previous input data signal Din_pre corresponds to data that was input just before a currently input data signal. In the case of the first data bus inversion block 210, there may be no previous input data, so a pre-determined initial value may be used. For example, in the initial value of the previous input data signal Din_pre, all bit signals can have a first logic state or a second logic state, and/or another data signal may be used.

After deciding whether the first input data signal Din_F0 is to be inverted or not, an output data signal Dout_F0 obtained by inverting, or not inverting, the first input data signal Din_F0 in response to the decision result, is output. The first data bus inversion block 210 also outputs an information signal DIEN_FO, Dinv_F0 indicating the inversion or non-inversion of the first input data signal Din_F0. The information signal DIEN_FO is transmitted together with the first output data signal Dout_F0, and is an instruction signal which provides information as to whether the first output data signal Dout_F0 is an inverted or non-inverted version of the first input data signal Din_F0. An information signal Dinv_F0, also indicating the inversion or non-inversion of the first input data signal Din_F0, is input to a second data bus inversion block 220. The information signals DIEN_FO and Dinv_F0 indicating the inversion or non-inversion have the same logic state, but are herewith provided with different reference characters for explanatory purposes only.

When a second input data signal Din_S0 is input, a second data bus inversion block 220 operates. The second data bus inversion block 220 compares the second input data signal Din_S0 with a first input data signal Din_F0 as a previous input data, receives an information signal Dinv_F0 indicating inversion or non-inversion of the first data signal, and then decides whether the second input data signal Din_S0 is to be inverted or not. A second output data signal Dout_S0 obtained by inverting, or not inverting, the second input data signal Din_S0 according to the decision result is output. The second data bus inversion block 220 also outputs information signals DIEN_SO and Dinv_S0 indicating the inversion or non-inversion of the second input data signal Din_S0. The information signal DIEN_SO is transmitted together with the second output data Dout_S0. The information signal Dinv_S0 is input to a third data bus inversion block 230. The information signals DIEN_S0 and Dinv_S0 indicating the inversion or non-inversion of the second output data signal Dout_S0 have the same logic state, but have different reference characters in the drawings, for explanatory purposes only.

A third input data signal Din_F1 is input and the third data bus inversion block 230 operates. The third data bus inversion block 230 compares the third input data signal Din_F1 with the second input data signal Din_S0 as a previous input data signal, receives an information signal Dinv_S0 indicating the inversion or non-inversion of the second input data signal Din_S0, and then decides whether the third data signal Din_F1 is to be inverted or not. An output data signal Dout_F1 obtained by inverting, or not inverting, the third data signal Din_F1 according to the decision result is output. The third data bus inversion block 230 also outputs information signals DIEN_F1 and Dinv_F1 indicating the inversion or non-inversion of the third input data signal Din_F1. The information signal DIEN_F1 indicating the inversion or non-inversion is transmitted together with the third output data signal Dout_F0, and is an instruction signal indicating whether the third output data signal Dout_F1 is an inverted or non-inverted version of the third input data signal Din_F1. The information signal Dinv_F1 indicating other inversion or non-inversion is input to a fourth data bus inversion block 240. The information signals DIEN_F1 and Dinv_F1 have the same logic state, but for explanatory purposes only, have different reference characters in the drawings.

Like the operations of the first through third data bus inversion blocks 210, 220 and 230, fourth to eighth data bus inversion blocks 240, 250, 260, 270 and 280 also operate to output fourth to eighth output data signals Dout_S1, Dout_F2, Dout_S2, Dout_F3 and Dout_S3.

In a semiconductor memory device having the data bus inversion circuit 200, if the number of continuously output data signals is different from 8 in a data read operation, the number of data bus inversion blocks may be changed accordingly.

Data latch signals Data_lat_P1 and Data_lat_P2 are provided as input signals to the plurality of data bus inversion blocks 210, 220, 230, 240, 250, 260, 270 and 280, to control the blocks.

The data bus inversion blocks 210, 220, 230, 240, 250, 260, 270 and 280 are individually controlled by the data latch signals Data_lat_P1 and Data_lat_P2.

Figure 7:
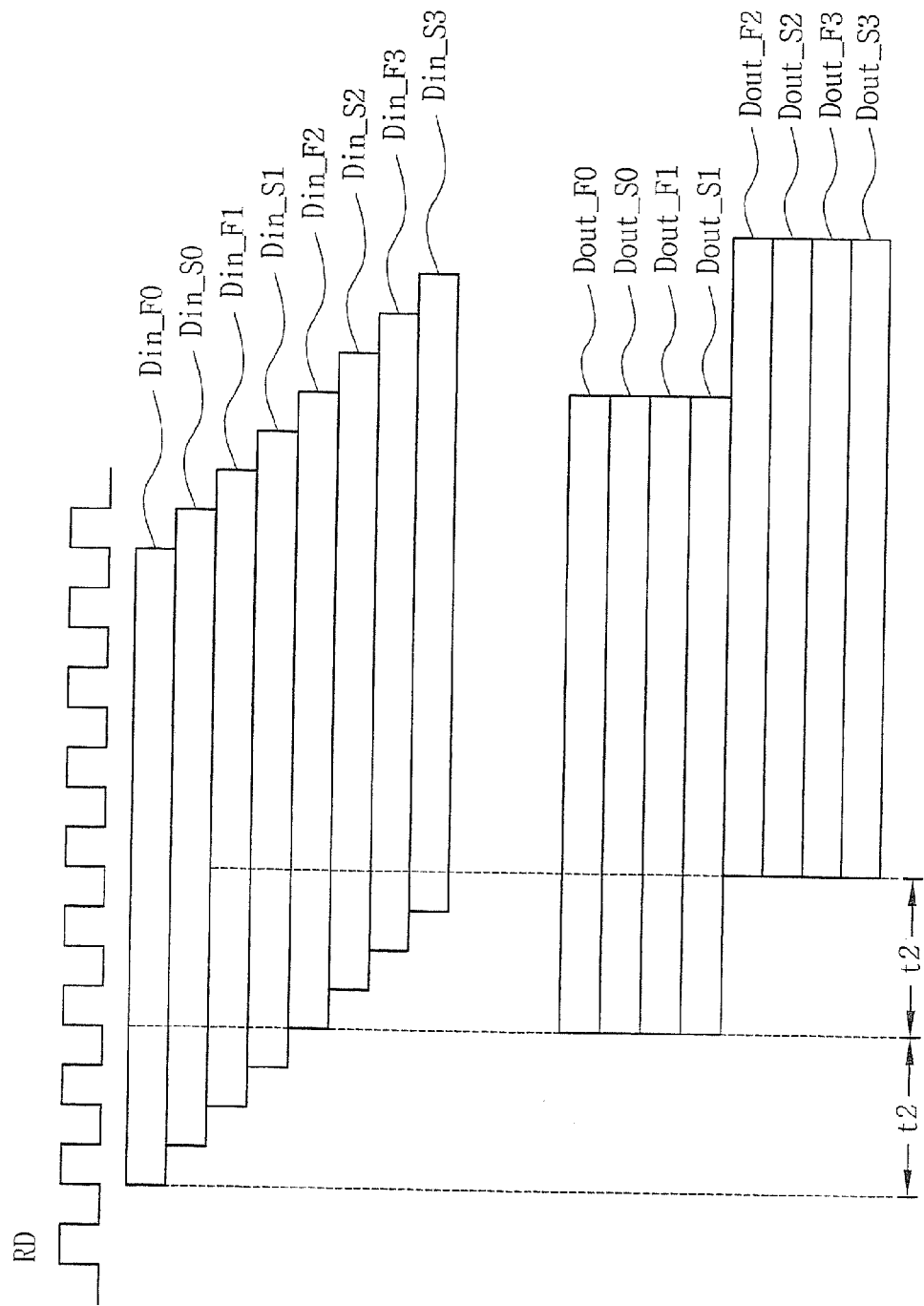
FIGS. 7 and 8 illustrate outputs of data controlled by the latch signals of FIG. 6.

The first output data signal to the eighth output data signal Dout_F0, Dout_S0, Dout_F1, Dout_S1, Dout_F2, Dout_S2, Dout_F3 and Dout_S3 output corresponding to first input data signal to the eighth input data signal Din_F0, Din_S0, Din_F1, Din_S1, Din_F2, Din_S2, Din_F3 and Din_S3 are latched by data latch signals Data_lat_P1 and Data_lat_P2. That is, the first output data signal to the eighth output data signal Dout_F0, Dout_S0, Dout_F1, Dout_S1, Dout_F2, Dout_S2, Dout_F3 and Dout_S3 are output only when one of the data latch signals Data_lat_P1, Data_lat_P2 is input. For example, as shown in FIG. 6, the output of first to fourth data inversion blocks 210, 220, 230 and 240 from the data bus inversion blocks 210, 220, 230, 240, 250, 260, 270 and 280 is controlled by a first data latch signal Data_lat_P1, and the output of fifth to eighth data bus inversion blocks 250, 260, 270 and 280 is controlled by a second data latch signal Data_lat_P2. Such data output example is shown in FIG. 7. As shown in FIG. 7, when the first to eighth input data signals are continuously input, first to eighth output data signals Dout_F0, Dout_S0, Dout_F1, Dout_S1, Dout_F2, Dout_S2, Dout_F3 and Dout_S3 are output as follows. The first output data signal to fourth output data signal Dout_F0, Dout_S0, Dout_F1 and Dout_S1 are output simultaneously at a generation time point of the fourth output data signal Dout_S1, in response to the first data latch signal Data_lat_P1, and at a generation time point of the eighth output data signal, the fifth to eighth output data signals Dout_F0, Dout_S0, Dout_F1 and Dout_S1 are simultaneously output in response to the second latch signal Data_lat_P2.

Figure 8:
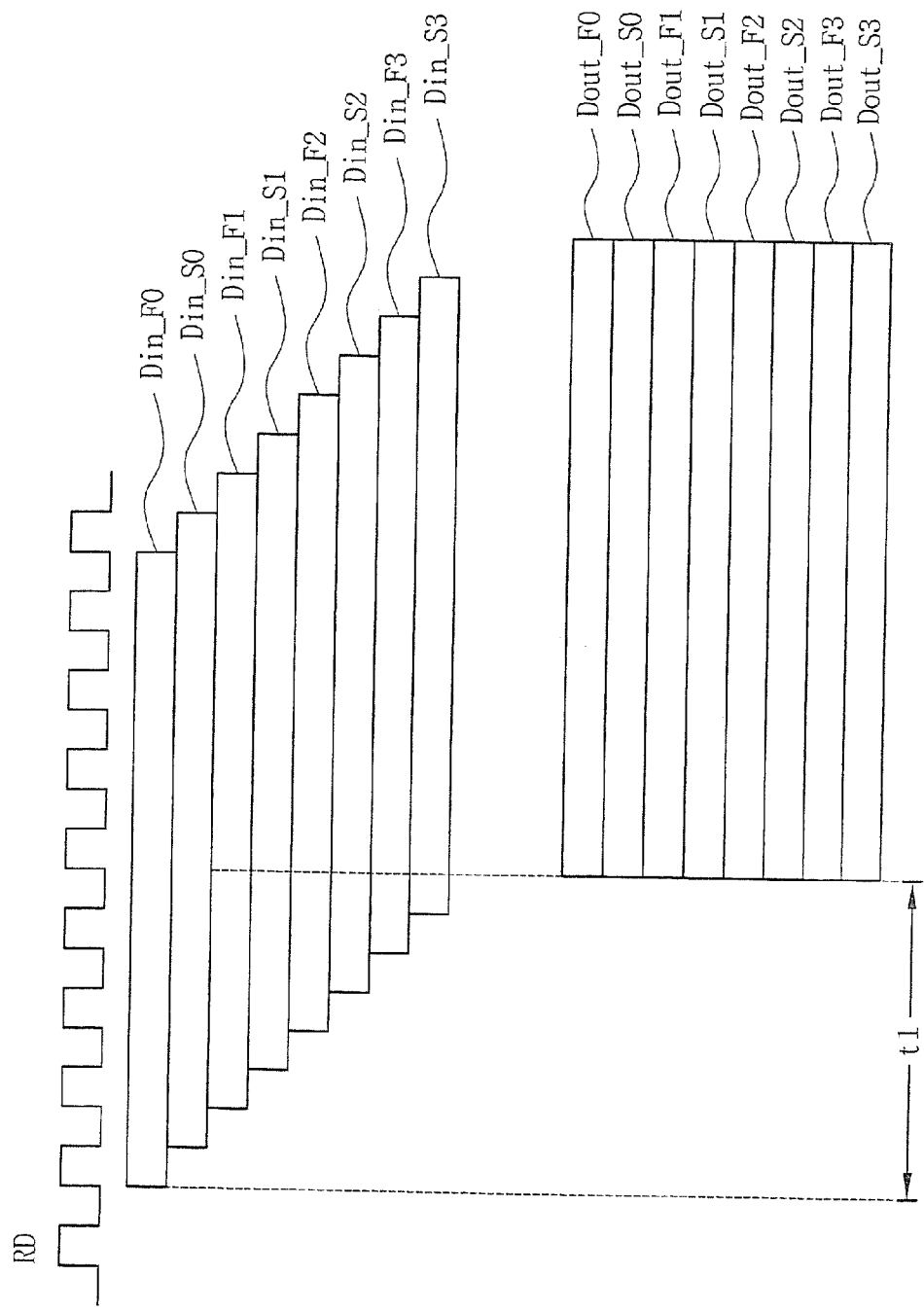

FIG. 8 illustrates the case that eight data signals are simultaneously latched and output.

With reference to FIG. 8, in the data bus inversion circuit 200, when first input data to eighth input data signals Din_F0, Din_S0, Din_F1, Din_S1, Din_F2, Din_S2, Din_F3 and Din_S3 are input continuously, first to eighth output data signals Dout_F0, Dout_S0, Dout_F1, Dout_S1, Dout_F2, Dout_S2, Dout_F3 and Dout_S3 are output simultaneously at a generation time point of the eighth output data signal Dout_S3.

FIGS. 6, 7 and 8 illustrate only the cases in which four or eight output data signals are output simultaneously, but the number of simultaneously output data signals can be modified.

As described above, the number of data bus inversion circuits controlled by the data latch signal Data_lat_P1, Data_lat_P2 can be controlled, and so an output time point of output data signals can be controlled. In particular, in a semiconductor memory device used for a system requiring a high operating frequency, it may be desirable to reduce the time tAA taken until data of the memory cell is output. In this case, the time tAA taken until data of memory cell is output can be controlled. As shown in FIG. 8, when eight output data signals are simultaneously output, the time tAA taken to output data of memory cell is 't1', while, as shown in FIG. 7, when each of the four output data signals is output, time tAA taken to output data of memory cell is 't2', where 't1' is twice 't2'. The time tAA taken in outputting data of memory cell can be controlled by controlling the number of data inversion circuits controlled by one data latch signal.

Figure 9:
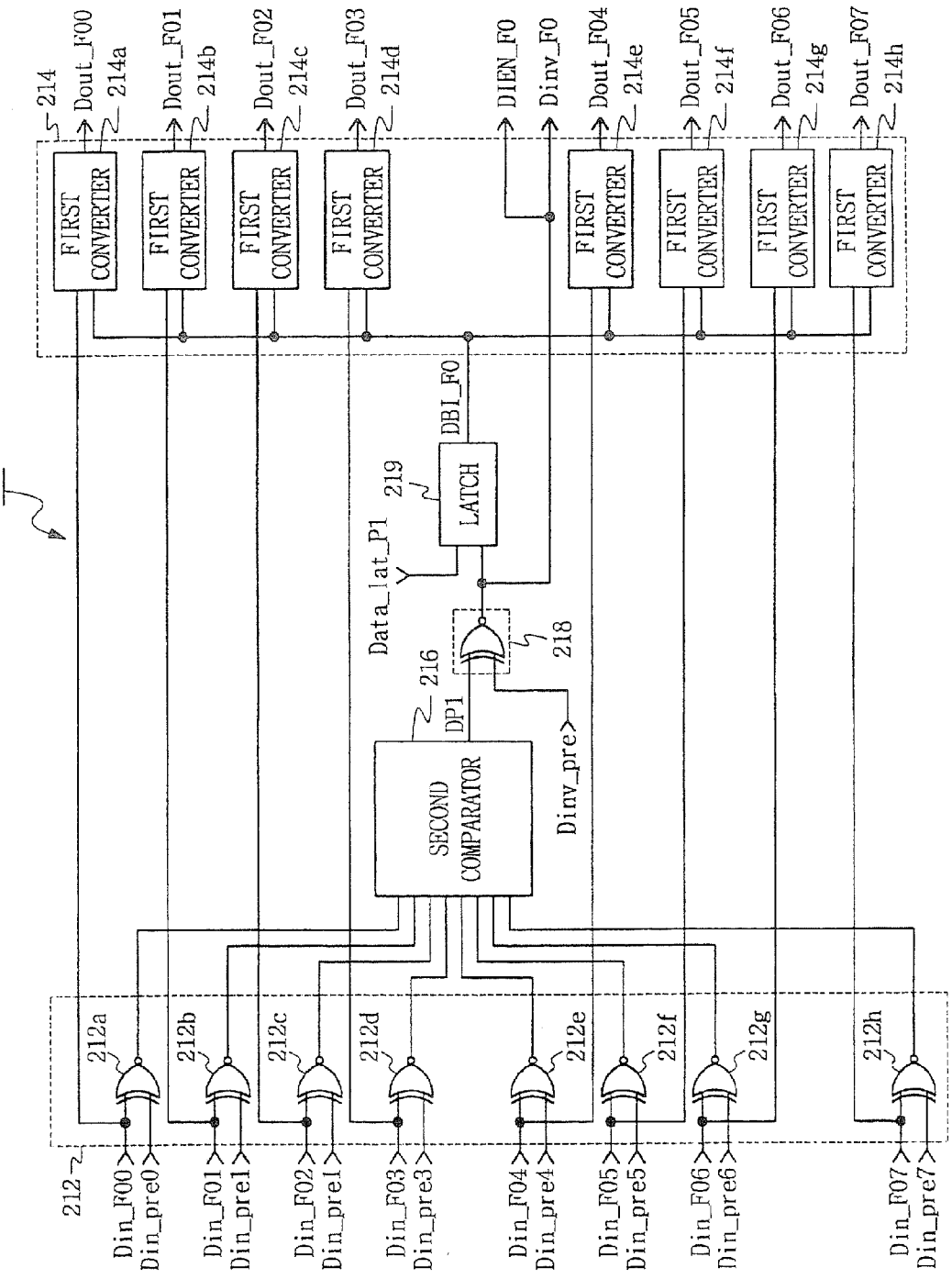
FIG. 9 is a circuit diagram of the first data bus inversion block shown in FIG. 6.

FIG. 9 illustrates an exemplary embodiment of the first data bus inversion block 210 shown in FIG. 6.

The first data bus inversion block 210 is configured for the case that the number of bit signals of the first input data signal is 8, that is, for the case of an 8-bit input data signal. A first input data signal Din_F0 is constructed of eight bit signals Din_F00, Din_F01, Din_F02, Din_F03, Din_F04, Din_F05, Din_F06 and Din_F07, and each of the bit signals may have a first logic state or a second logic state.

Referring to FIG. 9, the first data bus inversion block 210 includes data comparing units 212 and 216 and an inversion deciding unit 218, which together form a comparison deciding unit, and a data converting unit 214.

The data comparing units 212, 216 compare a currently input first input data signal Din_F0 with a previously input data signal Din_pre, on a bit-by-bit basis, and determine a changed logic bit number and an unchanged logic bit number of the first input data signal Din_F0. The changed logic bit number indicates how many bits in respective bit signals of a first input data signal Din_F0 were changed from respective bit signals of a previous input data signal Din_pre, and the unchanged logic bit number indicates the number of logic bits that were unchanged from the previous input data signal Din_pre to the first input data signal Din_F0. The data comparing units 212, 216 output an AC comparison signal DP1 based on a comparison of the changed logic bit number and the unchanged logic bit number.

The data comparing units 212, 216 may include a first comparator 212 and a second comparator 216.

The first comparator 212 may include a plurality of XNOR circuits 212a, 212b, 212c, 212d, 212e, 212f, 212g and 212h, which individually correspond to bit signals Din_F00, Din_F01, Din_F02, Din_F03, Din_F04, Din_F05, Din_and Din_F07 of the first input data signal Din_F0. An XNOR circuit, e.g., 212a, receives a bit signal, e.g., Din_F00, as a first input, from the bit signals Din_F00, Din_F01, Din_F02, Din_F03, Din_F04, Din_F05, Din_F06 and Din_F07 of the first input data signal Din_F0; and receives a bit signal, e.g., Din_pre0, of a corresponding previous input data signal Din_pre, as a second input. The first comparator 212 determines the changed logic bit number and unchanged logic bit number of the first input data signal Din_F0. For example, the first comparator 212 compares the logic state of respective bit signals Din_F00, Din_F01, Din_F02, Din_F03, Din_F04, Din_F05, Din_F06 and Din_F07 of the first input data signal Din_F0, with the logic state of respective bit signals Din_pre0, Din_pre1, Din_pre2, Din_pre3, Din_pre4, Din_pre5, Din_pre6 and Din_pre7 of the previous input data signal Din_pre.

As an example, the bit signals Din_pre0, Din_pre1, Din_pre2, Din_pre3, Din_pre4, Din_pre5, Din_pre6 and Din_pre7 constituting the previous input data signal Din_pre may be "1,1,1,1,1,1,1,1", and the bit signals Din_F00, Din_F01, Din_F02, Din_F03, Din_F04, Din_F05, Din_F06 and Din_F07 constituting the first input data signal Din_F0 may be input as, for example, "1,0,0,1,0,0,1,0". In this case, in the comparison with the bit signals Din_pre0, Din_pre1, Din_pre2, Din_pre3, Din_pre4, Din_pre5, Din_pre6 and Din_pre7 of the previous input data signal Din_pre, the bit signals Din_F00, Din_F01, Din_F02, Din_F03, Din_F04, Din_F05, Din_F06 and Din_F07 of the first input data signal Din_F0 are obtained from a state change of the second bit signal Din_F01, the third bit signal Din_F02, the fifth bit signal Din_F04, the sixth bit signal Din_F05, and the eighth bit signal Din_F07. Thus the changed logic bit number is five and the unchanged logic bit number is three. In this case, an output signal of the first comparator 212 will be "0,1,1,0,1,1,0,1".

The second comparator 216 may include a differential amplifier circuit. The differential amplifier circuit may include a first input terminal to which output signals of the respective XNOR circuits 212a, 212b, 212c, 212d, 212e, 212f, 212g and 212h constituting the first comparator 212 are input in parallel; and a second input terminal to which inversion signals of respective output signals of the respective XNOR circuits 212a, 212b, 212c, 212d, 212e, 212f, 212g and 212h are input in parallel. The second comparator 216 outputs an AC comparison signal DP1 by comparing the changed logic bit number with the unchanged logic bit number of the first input data signal Din_F0. The differential amplifier circuit may be implemented using the same or similar circuit as shown in FIG. 4, and/or may be configured to have other input signals.

When the second comparator 216 is configured similar to the circuit referred to in FIG. 4 and the output signal of first comparator 212 is "0,1,1,0,1,1,0,1", an AC comparison signal DP1, which is provided as an output signal of the second comparator 216, has a logic 'high' level. The logic 'high' level can be expressed as data '1' or a second logic state. The logic 'low' level can be expressed as data '0' or a first logic state.

When a logic 'high' signal is output as the AC comparison signal DP1 by the second comparator 216, it indicates that the changed logic bit number of the first input data signal Din_F0 is less than or equal to the unchanged logic bit number. Also, when a logic 'low' signal is output as the AC comparison signal DP1 in the second comparator 216, it indicates that the changed logic bit number of the first input data signal Din_F0 is more than the unchanged logic bit number.

The inversion deciding unit 218 receives the AC comparison signal DP1 output from the second comparator 216 and an information signal $Dinv_{pre}$ indicating the inversion or non-inversion of the previous input data signal, and decides whether the first input data signal Din_F0 is to be inverted or not. The inversion deciding unit 218 outputs a control signal Dinv_F0 based on the decision. The information signal Dinv_pre indicating the inversion or non-inversion of the previous input data signal can be provided as a logic 'high' state as an initial value. When the information signal Dinv_pre has a logic 'high' level, it indicates that the previous input data signal Din_pre was not inverted. When the information Dinv_pre has a logic 'low' level, it indicates that the previous input data signal Din_pre was inverted.

The inversion deciding unit 218 may include an XNOR circuit that receives an AC comparison signal DP1 from the second comparator 216 as a first input, and that receives an information signal Dinv_pre indicating inversion or non-inversion of the previous input data signal Din_pre, as a second input. The inversion deciding unit 218 outputs a control signal Dinv_F0 indicating whether the current input data signal should be inverted. A control signal DIEN_F0, which has the same state as the control signal Dinv_F0, functions as an instruction signal to indicate whether the first input data signal Din_F0 will be inverted or not.

For example, when the AC comparison signal DP1 of the second comparator 216 is output as a logic 'high' level and the information signal Dinv_pre indicating the inversion or non-inversion of the previous input data signal Din_pre has a logic 'high' level, the output signal Dinv_F0 of the inversion deciding unit 218 has a logic 'high' level, which indicates that the first output data signal Dou_F0 was not inverted.

As another example, when the AC comparison signal DP1 output by the second comparator 216 has a logic 'high' level and the information signal Dinv_pre has a logic 'low' level, an output signal Dinv_F0 of the inversion deciding unit 218 has a logic 'low' level, which indicates that the first input data signal Din_F0 should be inverted. In other words, since the previous input data signal Din_pre has the inverted state, even though the AC comparison signal DP1 of the second comparator 216 has a logic 'high' level, the current input data signal Din_F0 will be inverted.

As still another example, when the AC comparison signal DP1 of the second comparator 216 is output as a logic 'low' level and the information signal Dinv_pre indicating inversion or non-inversion of the previous input data signal Din_pre has a logic 'high' level, an output signal Dinv_F0 of the inversion deciding unit 218 has a logic 'low' level, which indicates that the first input data signal Din_F0 should be inverted. That is, since the previous input data signal Din_pre has the non-inverted state, when the AC comparison signal DP1 of the second comparator 216 has a logic 'low' level, the current input data signal Din_F0 will be inverted.

As yet another example, when the AC comparison signal DP1 of the second comparator 216 has a logic 'low' level and the information signal Dinv_pre indicating inversion or non-inversion of the previous input data signal Din_pre has a logic 'low' level, an output signal Dinv_F0 of the inversion deciding unit 218 has a logic 'high' level, which indicates that the first input data signal Din_F0 should not be inverted. That is, when the previous input data signal Din_pre has the inverted state, and the AC comparison signal DP1 of the second comparator 216 has a logic 'low' level, the current input data signal Din_F0 should not be inverted.

This result is a consequence of the purpose of the data bus inversion circuit 200. That is, when a first data signal and a second data signal are input successively, in comparing with bit signals of a first output data output from the data bus inversion circuit 200, the changed logic bit number of bit signals of a second output data signal should become the fewest in the output signal. When the changed logic bit number of the current input data signal is small compared with that of a previous input data signal, it may result in reduced current consumption and/or signal noise in a data transmission or other operation of an output driver circuit.

If the latch 219 of FIG. 9 were not included, the control signal Dinv_F0 would immediately be provided as an AC inversion control signal DBI_F0. However, when the latch 219 is included, the output signal Dinv_F0 of the inversion deciding unit 218 is latched in the latch 219. The latch 219 latches the control signal Dinv_F0 until the first data latch signal Data_lat_P1 is input, then outputs an AC inversion control signal DBI_F0 when the first data latch signal Data_lat_P1 is input. The latch 219 can be realized with various kinds of latch circuits capable of performing the above-described function.

The data converting unit 214 inverts, or does not invert, the first input data signal Din_F0, in response to the AC inversion control signal DBI_F0 output from the inversion unit 218 and/or the latch 219. The data converting unit 214 includes first to eighth converters 214a, 214b, 214c, 214d, 214e, 214f, 214g and 214h, which are configured to invert, or not invert, respective bit signals of the first input data signal Din_F0. The number of converters 214a, 214b, 214c, 214d, 214e, 214f, 214g and 214h can be changed depending on the number of bits in the first input data signal Din_F0.

The data converting unit 214 may include circuits similar to those illustrated in FIG. 5.

The data converting unit 214 may include buffer circuits to which bit signals of the first input data signal Din_F0 are each input, and first switching circuits for switching the buffer circuits. The data converting unit 214 may also include inverter circuits to which bit signals of the first input data signal Din_F0 are each input, and second switching circuits for switching the inverter circuits. The first switching circuits and the second switching circuits are controlled by the AC inversion control signal DBI_F0. As an example, the first converter 214a includes a buffer circuit to which a first bit signal Din_F00 of a first input data signal Din_F0 is input, and a first switching circuit for switching the buffer circuit, thus forming a non-inversion path of data. Also, the first converter 214a includes an inverter circuit to which a first bit signal Din_F00 of a first input data signal Din_F0 is input, and a second switching circuit for switching the inverter circuit, thus forming an inversion path of data. The first input data signal Din_F0 may be output herein only by the first switching circuit without adapting the buffer circuit.

Operation of the data converting unit 214 will be described, for example, as follows.

For example, when the AC inversion control signal DBI_F0 has a logic 'high' level, the first switching circuits are closed, and the second switching circuits are opened. Thus, all of bit signals Din_F00, Din_F01, Din_F02, Din_F03, Din_F04, Din_F05, Din_F06 and Din_F07 of the first input data signal Din_F0 are input to the buffer circuits, and are not inverted. In contrast, when the AC inversion control signal DBI_F0 has a logic 'low' level, the first switching circuits are opened and the second switching circuits are closed. Thus, all of bit signals Din_F00, Din_F01, Din_F02, Din_F03, Din_F04, Din_F05, Din_F06 and Din_F07 of the first input data signal Din_F0 are each input to the inverter circuits, and are inverted.

Inverted or non-inverted data output by the data bus inversion circuit 200 as described above are transmitted to an external circuit and/or another semiconductor memory device, which receives the inverted or non-inverted data and an instruction signal DIEN, and determines whether the data was inverted or not inverted.

Figure 10:
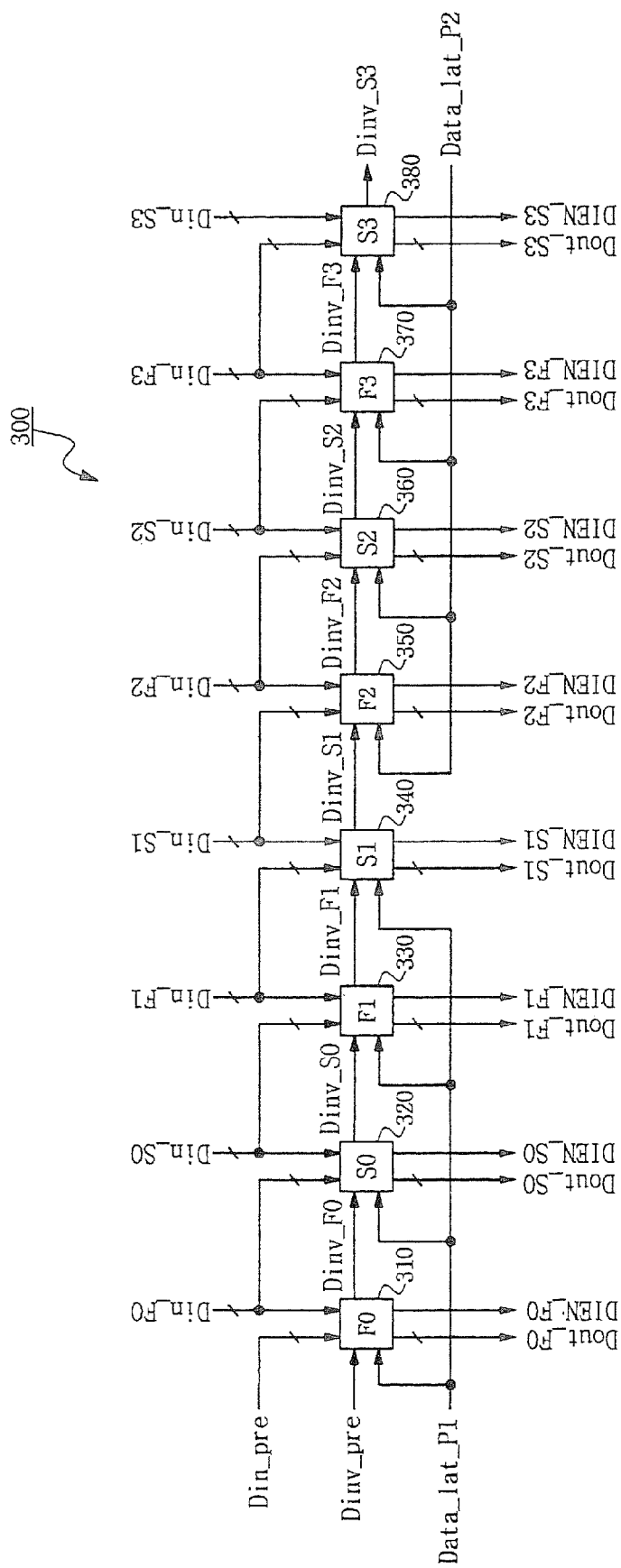
FIG. 10 is a block diagram of a data bus inversion circuit according to still further embodiments of the invention.

FIG. 10 is a block diagram of data bus inversion circuit according to still further exemplary embodiments of the invention.

As shown in FIG. 10, a data bus inversion circuit 300 according to still further exemplary embodiments of the invention operates in an AC mode in a first mode and operates in a DC mode in a second mode, and includes a plurality of data bus inversion blocks 310, 320, 330, 340, 350, 360, 370 and 380.

The plurality of data bus inversion blocks 310, 320, 330, 340, 350, 360, 370 and 380 are provided corresponding to the number of continuously input data signals, and respective internal circuits thereof have the same configuration, except that input signals and output signals are different from one another. It is assumed that the data bus inversion circuit 300 of FIG. 10 is adapted in a semiconductor memory device configured to continuously input or output eight data signals, and is configured to have eight data bus inversion blocks 310, 320, 330, 340, 350, 360, 370 and 380.

Operation of the respective data bus inversion blocks 310, 320, 330, 340, 350, 360, 370 and 380 will be described as follows. It is first assumed that first input data signal to the eighth input data signal Din_F0, Din_S0, Din_F1, Din_S1, Din_F2, Din_S2, Din_F3 and Din_S3 are continuously individually input to the data bus inversion blocks 310, 320, 330, 340, 350, 360, 370 and 380.

Operation of the DC mode as the second mode will be described first. In the DC mode, the data bus inversion blocks 310 to 380 do not need to have knowledge of a previous input data signal, but need to have only information for a current input data signal. In other words, when a first input data signal Din_F0 is input, the number of bits of respective bit signals of the first input data signal Din_F0 having a first logic state and the number of bits having a second logic state are determined. The first input data signal Din_F0 is inverted or not inverted, depending on whether the number of bits having the first logic state is greater than the number of bits having the second logic state. The inverted, or non-inverted, data signal is then output as a first output data signal Dout_F0. Through such operation, each of second input data signal to the eighth input data signal Din_S0, Din_F1, Din_S1, Din_F2, Din_S2, Din_F3 and Din_S3 is inverted, or not inverted, by each of second to eighth data bus inversion blocks 320, 330, 340, 350, 360, 370 and 380, and then is output as each of second to eighth output data signals Dout_S0, Dout_F1, Dout_S1, Dout_F2, Dout_S2, Dout_F3 and Dout_S3. When each data bus inversion block 310, 320, 330, 340, 350, 360, 370, 380 outputs each of first to eighth output data signals DoutF0, Dout_S0, Dout_F1, Dout_S1, Dout_F2, Dout_S2, Dout_F3 and Dout_S3, each of the data bus inversion blocks 310, 320, 330, 340, 350, 360, 370 and 380 also outputs corresponding instruction signals DIEN_F0, DIEN_S0, DIEN_F1, DIEN_S1, DIEN_F2, DIEN_S2, DIEN_F3 and DIEN_S3 to provide information regarding whether each output data signal DoutF0, Dout_S0, Dout_F1, Dout_S1, Dout_F2, Dout_S2, Dout_F3, Dout_S3 is an inverted or not.

Operation of the data bus inversion blocks 310 to 380 in an AC mode will be described as follows.

When a first input data signal Din_F0 is first input, the first data bus inversion block 310 compares the first input data signal Din_F0 with the previous input data signal Din_pre, and receives an information signal Dinv_pre indicating the inversion or non-inversion of the previous input data signal, and determines whether the first input data signal Din_F0 is to be inverted or not.

The first data bus inversion block 310 may have a predetermined initial value when there is no information for a previous input data signal. For example, in an initial value of the previous input data signal Din_pre, all bit signals can have a first logic state or a second logic state.

After deciding whether the first data signal Din_F0 is to be inverted or not, an output data signal Dout_F0, which is an inverted or non-inverted version of the first data signal Din_F0 according to the decision result, is output. The first data bus inversion block 310 also outputs an information signal DIEN_FO, Dinv_F0 indicating the inversion or non-inversion of the first data signal Din_F0. The information signal DIEN_FO is an instruction signal, and the information signal Dinv_F0 is input to a second data bus inversion block 320 and indicates whether the first output data signal Dout_F0 is inverted or not. The information signals DIEN_FO and Dinv_F0 may have the same logic state.

When a second input data signal Din_S0 is input, the second data bus inversion block 320 operates. The second data bus inversion block 320 compares the second input data signal Din_S0 with the first input data signal Din_F0 as a previous input data signal, receives an information signal Dinv_F0 indicating inversion or non-inversion of the first data signal, and determines whether the second input data signal Din_S0 is to be inverted or not. A second output data signal Dout_S0, which is obtained by inverting or not inverting the second input data signal Din_S0 according to the decision result, is output. The second data bus inversion block 320 also outputs information signals DIEN_SO and Dinv_S0 indicating an inversion or non-inversion of the second input data signal Din_S0. The information signal DIEN_SO is an instruction signal, and the information signal Dinv_S0 is input to a third data bus inversion block 330. The information signals DIEN_SO and Dinv_S0 indicating the inversion or non-inversion of the second output data signal Dout_S0, may have the same logic state.

When a third input data signal Din_F1 is input, the third data bus inversion block 330 operates. The third data bus inversion block 330 compares the third input data signal Din_F1 with the second input data signal Din_S0 as a previous input data signal, receives an information signal Dinv_S0 indicating the inversion or non-inversion of the second input data signal Din_S0, and decides whether the third data signal Din_F1 is to be inverted or not. An output data signal Dout_F1, which is obtained by inverting, or not inverting, the third data signal Din_F1 according to the decision result, is output. The third data bus inversion block 330 also outputs information signals DIEN_F1 and Dinv_F1 indicating the inversion or non-inversion of the third input data signal Din_F1. The information signal DIEN_F1 is an instruction signal, and the information signal Dinv_F1 is input to a fourth data bus inversion block 340. The information signals DIEN_F1 and Dinv_F1 may have the same logic state.

Like the operations of the first to third data bus inversion blocks 310, 320 and 330, fourth to eighth data bus inversion blocks 340, 350, 360, 370 and 380 also operate and output fourth to eighth output data signals Dout_S1, Dout_F2, Dout_S2, Dout_F3 and Dout_S3.

In a semiconductor memory device having the data bus inversion circuit 300, if the number of continuously output data signals is different from 8 in a data read operation, the number of data bus inversion circuits may be changed accordingly.

Among the signals that are each input to the plurality of data bus inversion blocks 310, 320, 330, 340, 350, 360, 370 and 380, to control the blocks, there are data latch signals Data_lat_P1 and Data_lat_P2.

The first output data signal to the eighth output data signal Dout_F0, Dout_S0, Dout_F1, Dout_S1, Dout_F2, Dout_S2, Dout_F3 and Dout_S3 output corresponding to first input data signal to the eighth input data signal Din_F0, Din_S0, Din_F1, Din_S1, Din_F2, Din_S2, Din_F3 and Din_S3 are latched by data latch signals Data_lat_P1 and Data_lat_P2, then are output at a designated time. That is, it is the structure that the first output data signal to the eighth output data signal Dout_F0, Dout_S0, Dout_F1, Dout_S1, Dout_F2, Dout_S2, Dout_F3 and Dout_S3 are output only when one of the data latch signals Data_lat_P1, Data_lat_P2 is input.

For example, as shown in FIG. 10, the output of first to fourth data inversion blocks 310, 320, 330 and 340 from the data bus inversion blocks 310, 320, 330, 340, 350, 360, 370 and 380 is controlled by a first data latch signal Data_lat_P1, and the output of fifth to eighth data bus inversion blocks 350, 360, 370 and 380 is controlled by a second data latch signal Data_lat_P2. As described above, the number of data bus inversion circuits controlled by one data latch signal of data latch signals Data_lat_P1 and Data_lat_P2 can be controlled, and thus the timing point of the output data signal can be controlled.

The regulation of output signal timing using the first and second data latch signals Data_lat_P1 and Data_lat_P2 is described above with reference to FIGS. 6 to 8.

Figure 11:
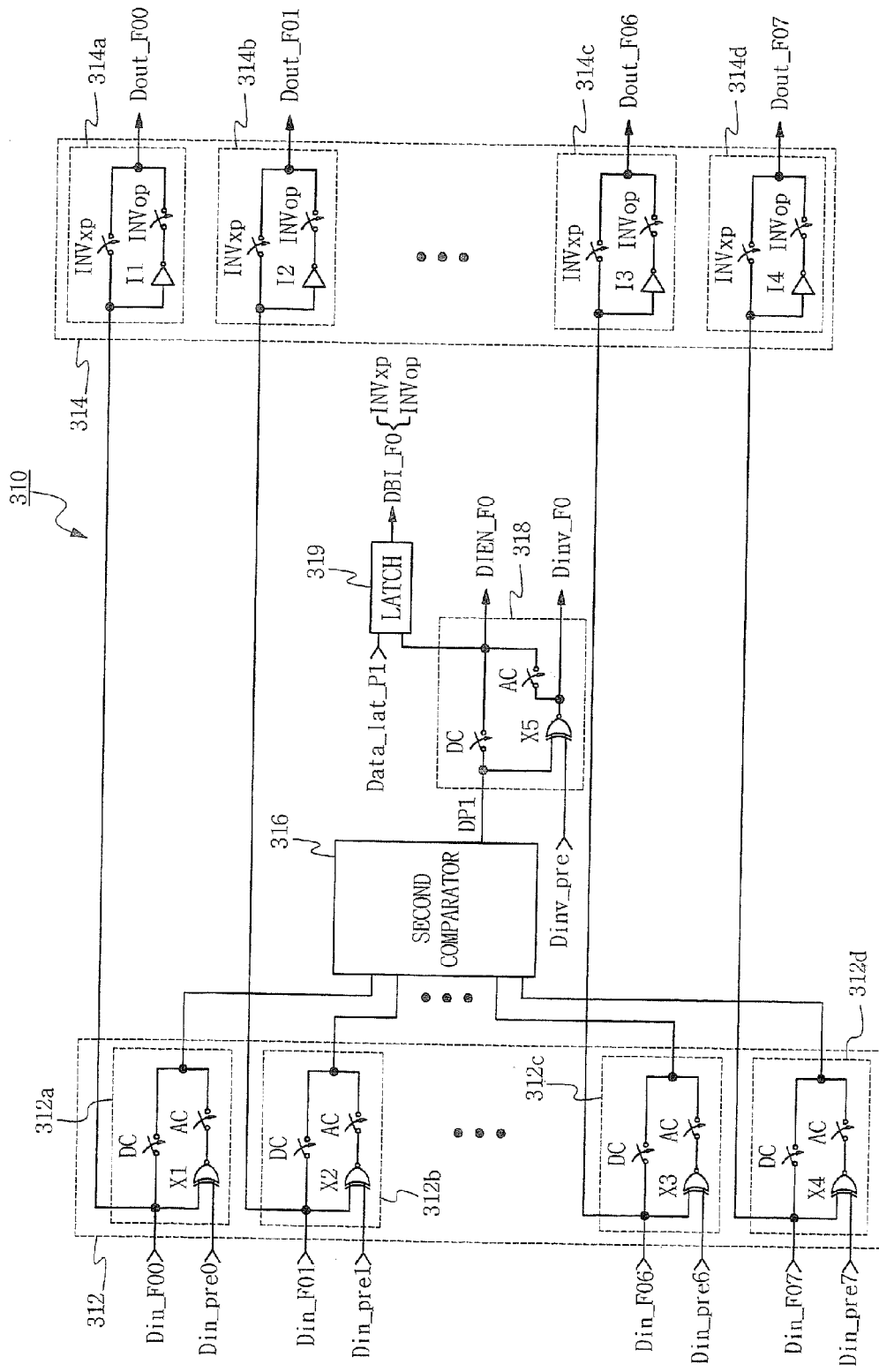
FIG. 11 is a circuit diagram of the first data bus inversion block shown in FIG. 10.

FIG. 11 illustrates an exemplary embodiment of the first data bus inversion block 310 shown in FIG. 10.

The first data bus inversion block 310 is configured for the case that the number of bit signals of first input data is 8, that is, for an 8 bit data signal. A first input data signal Din_F0 is constructed of eight bit signals Din_F00, Din_F01, Din_F02, Din_F03, Din_F04, Din_F05, Din_F06 and Din_F07, and each of the bit signals has a first logic state or second logic state.

With reference to FIG. 11, the first data bus inversion block 310 includes data comparing units 312 and 316 and an inversion deciding unit 318, which together form a comparison deciding unit, and a data converting unit 314.

The data comparing unit 312, 316 compares a currently input first input data signal Din_F0 with a previous input data signal Din_pre, on a bit-by-bit basis, in an AC mode as a first mode, and determines a changed logic bit number and an unchanged logic bit number of the first input data signal Din_F0, and outputs an AC comparison signal DP1 as a first comparison signal based on a comparison of the changed logic bit number and the unchanged logic bit number.

The data comparing unit 312, 316 compares the number of bits having a first logic state and the number of bits having a second logic state, for bit signals of a first input data signal Din_F0, in a DC mode as a second mode, and outputs a DC comparison signal DP1 as a second comparison signal based on the predominant logic states of the bits (i.e., based on whether the input data signal Din_F0 has more bits of a first logic state or a second logic state).

The data comparing unit 312, 316 may include a first comparator 312 and a second comparator 316. The first comparator 312 includes DC switching circuits DC for respective bit signals Din_F00, Din_F01, Din_F06 and Din_F07, the DC switching circuits DC being closed in the DC mode, to transmit the first input data signal Din_F0 intact as input, to the second comparator 316, and being opened in AC mode.

To perform the AC mode operation, the first comparator 312 includes a plurality of XNOR circuits X1, X2, X3 and X4, which individually correspond to bit signals Din_F00 to Din_F07 of the first input data signal Din_F0. An XNOR circuit, e.g., XNOR circuit X1, has a bit signal, e.g., Din_F00, as a first input, from the bit signals Din_F00 to Din_F07 of the first input data signal Din_F0; and has one bit signal, e.g., Din_pre0, of the corresponding previous input data signal Din_pre, as a second input. Each of the XNOR circuits X1, X2, X3 and X4 includes an AC switching circuit AC to operate the XNOR circuit X1, X2, X3, X4 only in the AC mode. The AC switching circuit AC is closed in the AC mode and so the XNOR circuits X1, X2, X3 and X4 operate in the AC mode. The AC switch is opened in other (DC) mode so as not to operate the XNOR circuits X1, X2, X3 and X4 in the DC mode. When the AC switching circuit AC is in the open state, even if the XNOR circuits X1, X2, X3 and X4 operate, output signals thereof may not be transferred to the second comparator 316.

In the DC mode of operation, the first comparator 312 transfers the first input data signal Din_F0 intact to the second comparator 316. In the AC mode, the same operation as operation of the first comparator 212 of FIG. 9 is performed.

The second comparator 316 may include a differential amplifier circuit. The differential amplifier circuit may include a first input terminal to which output signals of the first comparator 312 are input in parallel; and a second input terminal to which inverted versions of signals of respective output signals of the first comparator 312 are input in parallel. The differential amplifier circuit can include, for example, circuits described above in reference to FIG. 4.

In the DC mode of operation, the first comparator 312 transfers the first input data signal Din_F0 intact to the second comparator 316. In the AC mode, the same operation as the operation of the first comparator 212 of FIG. 9 may be performed.

In the AC mode, the second comparator 316 outputs an AC comparison signal DP1 based on a comparison of a changed logic bit number of the first input data signal Din_F0 with an unchanged logic bit number. When the AC comparison signal DP1 has a logic 'high' signal, it indicates that the changed logic bit number of the first input data signal Din_F0 is less than or equal to the unchanged logic bit number. When a logic 'low' signal is output as an AC comparison signal DP1 in the second comparator 316, it indicates that the changed logic bit number of the first input data signal Din_F0 is more than the unchanged logic bit number. In the AC mode, the operation may be similar to the operation of the second comparator 316 shown in FIG. 9.

In an AC mode the inversion deciding unit 318 receives and compares the AC comparison signal DP1 output from the second comparator 316 and information signal Dinv_pre indicating inversion or non-inversion of the previous input data signal Din_pre, and decides whether the first input data signal Din_F0 is to be inverted or not, and outputs a control signal Dinv_F0 indicating whether the first input data signal Din_F0 is inverted or not. The information signal Dinv_pre indicating the inversion or non-inversion of the previous input data signal can be provided as a logic 'high' state as an initial value. When the information signal Dinv_pre indicating the inversion or non-inversion of the previous input data is has a logic 'high' level, it indicates that the previous input data signal Din_pre was not inverted. When the information Dinv_pre has a logic 'low' level, it indicates that the previous input data signal Din_pre was inverted. A control signal DIEN_F0 (which has the same logic state as the control signal Dinv_F0) functions as an instruction signal for providing information as to whether the first input data signal Din_F0 was inverted or not.

In a DC mode of operation, the inversion deciding unit 318 outputs the DC comparison signal DP1 intact, without changing the logic state of the signal. That is, in a DC mode, the inversion deciding unit 318 outputs a DC inversion control signal DBI_F0 as a second inversion control signal.

To perform the AC mode operation, the inversion deciding unit 318 may include an XNOR circuit X5 that is configured to receive an AC comparison signal DP1 from the second comparator 316 as a first input, and an information signal Dinv_pre indicating the inversion or non-inversion of the previous input data signal Din_pre, as a second input. The inversion deciding unit 318 is further configured to output a control signal Dinv_F0 to indicate whether the first input data signal Din_F0 is inverted or not. The XNOR circuit X5 includes an AC switching circuit AC that is configured to operate the XNOR circuit X5 only in the AC mode. The AC switching circuit AC is closed in the AC mode and so the XNOR circuit X5 operates. The AC switching circuit AC is opened in the other (DC) mode so as not to operate the XNOR circuit X5. When the AC switching circuit AC is open, even if the XNOR circuit X5 operates, the output signal Dinv_F0 thereof is not transferred to the outside.

To perform the DC mode operation, the inversion deciding unit 318 includes a DC switching circuit DC that is closed in the DC mode and is opened in the other (AC) mode.

In the DC mode of operation, the inversion deciding unit 318 outputs the DC comparison signal DP1 intact as output from the second comparator 316, without a change of logic state. That is, the inversion deciding unit 318 outputs a DC inversion control signal DBI_F0 as a second inversion control signal in the DC mode, and outputs an AC inversion control signal DBI_F0 as a first inversion control signal in the AC mode. Such operation is similar to the operation of the inversion deciding unit 218 shown in FIG. 9.

If the latch 319 of FIG. 11 is not included, the control signal Dinv_F0 in the AC mode would be immediately provided as an AC inversion control signal DBI_F0, and the DC comparison signal DP1 in the DC mode would be immediately output as a DC inversion control signal DBI_F0. Meanwhile, when the latch 319 is included, output signals DIEN_F0 and Dinv_F0 of the inversion deciding unit 318 are latched in the latch 319. The latch 319 latches the control signal DIEN_F0, Dinv_F0 until the first data latch signal Data_lat_P1 is input, then outputs a DC inversion control signal DBI_F0 in the DC mode and outputs an AC inversion control signal DBI_F0 in the AC mode, when the first data latch signal Data_lat_P1 is input. The latch 319 can be realized by various kinds of latch circuits capable of performing such functions described above.

The data converting unit 314 inverts, or does not invert, and outputs, the first input data signal Din_F0 in response to the DC inversion control signal DBI_F0 or the AC inversion control signal DBI_F0 output from the inversion deciding unit 318 or the latch 319. In the following discussion, the DC inversion control signal DBI_F0 and the AC inversion control signal DBI_F0 will be commonly referred to as an inversion control signal DBI_F0.

The data converting unit 314 includes bit signal converters 314a, 314b, 314c and 314d, to invert or not invert respective bit signals of the first input data signal Din_F0. The number of the converters 314a, 314b, 314c and 314d may be changed depending on number of bits in the first input data signal Din_F0.

The data converting unit 314 can include circuits such as those shown in FIG. 5.

The data converting unit 314 may include buffer circuits to which bit signals of the first input data signal Din_F0 are each input, and first switching circuits INVxp for switching the buffer circuits. The data converting unit 314 may also include inverter circuits I1 to I4 to which bit signals of the first input data signal Din_F0 are each input, and second switching circuits INVop for switching the inverter circuits I1 to I4. The first switching circuits INVxp and the second switching circuits INVop may be controlled by the inversion control signal DBI_F0.

As an example, in the converters 314a to 314d, the first converter 314a may include a buffer circuit to which a first bit signal Din_F00 of a first input data signal Din_F0 is input, and a first switching circuit INVxp for switching the buffer circuit, thus forming a non-inversion path of data. Also, the first converter 314a may include an inverter circuit I1 to which a first bit signal Din_F00 of a first input data signal Din_F0 is input, and a second switching circuit INVop for switching the inverter circuit I1, thus forming an inversion path of data. The data converting unit 314 may be configured so that the first input data signal Din_F0 is directly output only by the first switching circuit INVxp without employing the buffer circuit.

Operation of the data converting unit 314 according to some embodiments of the invention will be described as follows.

When the inversion control signal DBI_F0 is output as a logic 'high' level, the first switching circuits INVxp are closed, and the second switching circuits INVop are opened. Thus, all of bit signals Din_F00, Din_F01, Din_F06 and Din_F07 of the first input data signal Din_F0 are input to the buffer circuits, and are not inverted. In contrast, when the inversion control signal DBI_F0 is output as a logic 'low' level, the first switching circuits INVxp are opened and the second switching circuits INVop are closed. Thus, all of bit signals Din_F00, Din_F01, Din_F06 and Din_F07 are each input to the inverter circuits I1, I2, I3 and I4, and are inverted.

Inverted, or non-inverted, data output by the data bus inversion circuit 300 as described above are transmitted to the outside, and another semiconductor memory device receives the inverted or non-inverted data and an instruction signal DIEN, and decides whether the data was inverted or not inverted.

Figure 12:
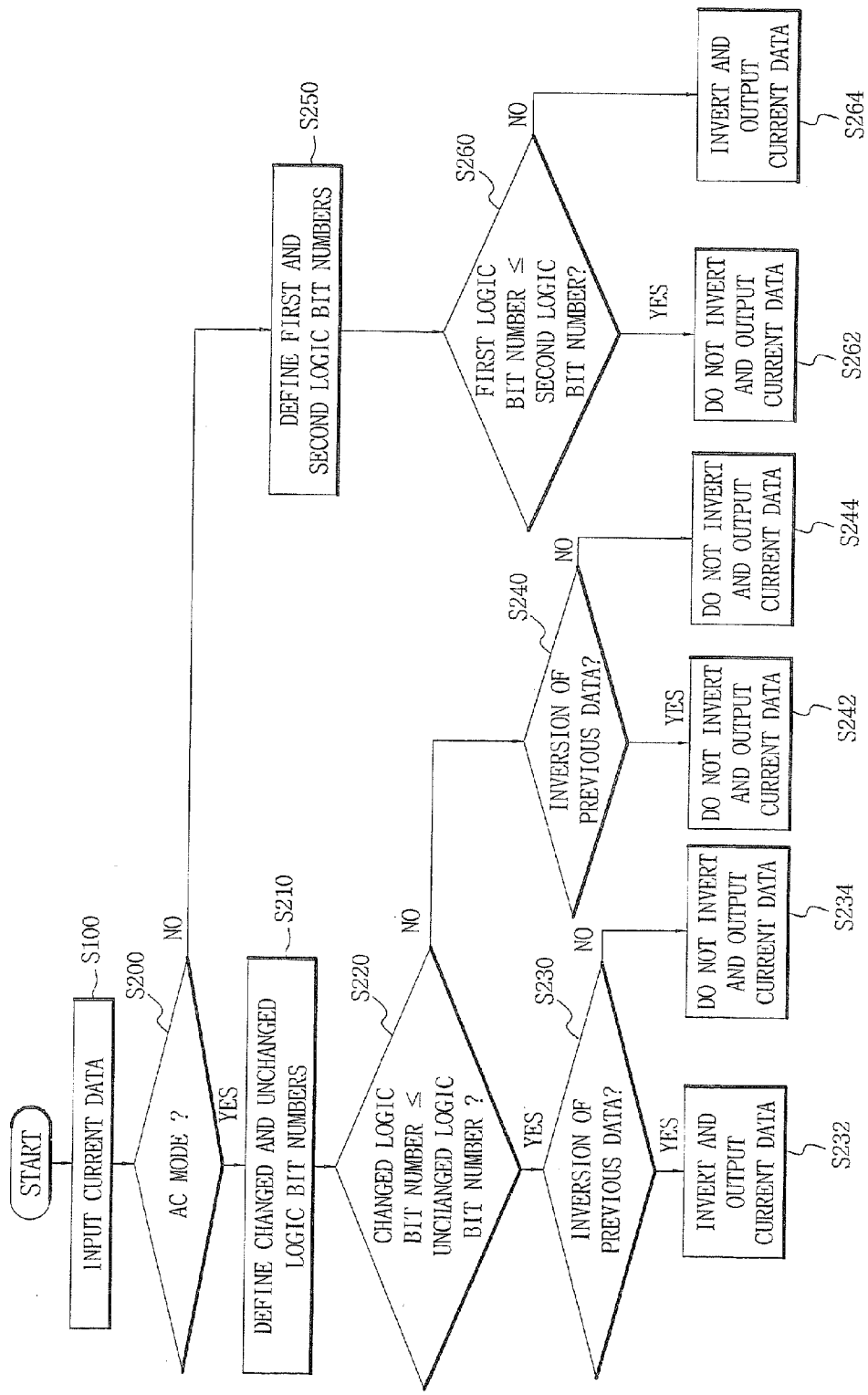
FIG. 12 is a flowchart illustrating operations of a data bus inversion circuit according to some embodiments of the invention.

FIG. 12 illustrates a flowchart illustrating some operations of the first data bus inversion circuit 300 shown in FIG. 11.

With reference to FIG. 12, when operation begins, a first input data signal Din_F0 as a current input data is input in a step S100. When the first input data signal Din_F0 is input, it is decided in a step S200 an AC mode or a DC mode of operation is to be used. The sequence of the step S100 in which the first input data signal Din_F0 is input and the step S200 of deciding whether the AC mode or the DC mode should be used, may be changed.

When the AC mode is chosen, the first input data signal Din_F0 and a previous input data signal Din_pre are compared on a bit-by-bit basis, and a changed logic bit number and an unchanged logic bit number are determined in a step S210. It is then decided in a step S220 whether the changed logic bit number is less than or equal to the unchanged logic bit number. If the changed logic bit number is less than or equal to the unchanged logic bit number, it is decided in a step S230 whether the previous input data signal Din_pre was inverted or not. When the previous input data signal Din_pre was inverted, all of the respective bit signals of the first input data signal Din_F0 are inverted and output in a step S232. When the previous input data signal Din_pre was not inverted, the respective bit signals of the first input data signal Din_F0 are not inverted and are output in a step S234.

If the changed logic bit number is more than the unchanged logic bit number, it is again decided in a step S240 whether the previous input data signal Din_pre was inverted or not. When the previous input data signal Din_pre was inverted, the respective bit signals of the first input data signal Din_F0 are not inverted and are output in a step S242. if the previous input data signal Din_pre was not inverted, all of the respective bit signals of the first input data signal Din_F0 are inverted and are output in a step S244.

In the step S200 of deciding whether the AC mode or DC mode should be used, if the DC mode is chosen, respective bit signals of the first input data signal Din_F0 are classified into a first logic state and a second logic state, and the number of bits having the first logic state and the number of bits having the second logic state are determined in a step S250. It is then decided in a step S260 whether the first logic state bit number is less than or equal to the second logic state bit number. If the first logic state bit number is less than or equal to the second logic state bit number, the respective bit signals of the first input data signal Din_F0 are not inverted and are output in a step S262. If the first logic state bit number is more than the second logic state bit number, all of the respective bit signals of the first input data signal Din_F0 are inverted and are output in a step S264.

As described above, according to some embodiments of the invention, a data bus inversion circuit may reduce power consumption and/or signal noise, and may provide high-speed transmission of valid and/or precise data.

In some embodiments of the invention described above, a first logic state may indicate a data '0' and a second logic state may indicate a data '1'. Further, XOR circuits may be employed instead of the XNOR circuits with appropriate changes, and/or XOR and XNOR circuits may be used together.

As described above, according to some embodiments of the invention, the change in data bits may be substantially reduced, and a log of the logic state to reduce the power consumption may be provided, in the data transmission, whereby power consumption and/or signal noise in output circuits or input circuits may be reduced. Accordingly, data can be transmitted precisely and/or at a high speed. Furthermore, the operational mode of a data bus inversion circuit may be switched from an AC mode to/from a DC mode. Thus, the invention can be applied to various circuits with a single data bus inversion circuit.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A data bus inversion circuit for a semiconductor memory device, which selectively inverts, or does not invert, an input data signal including a plurality of serial bit signals on the basis of bit logic states of the bit signals, the circuit comprising:
    a comparison deciding unit configured to decide whether to invert the input data signal on the basis of an AC comparison signal, which represents a variation rate in the bit logic states of the input data signal with respect to a previous input data signal, and inversion information of the previous input data signal; and
    a data converting unit configured to invert, or not invert, the input data signal in response to the decision of the comparison deciding unit and to output the result as an output data signal.

2. The circuit of claim 1, wherein the comparison deciding unit comprises:
    a data comparing part configured to compare the input data signal and the previous input data signal, on a bit-by-bit basis, to define a changed logic bit number and an unchanged logic bit number of the input data signal, to compare the changed logic bit number to the unchanged logic bit number, and to output the comparison result as the AC comparison signal; and
    an inversion deciding part configured to receive the AC comparison signal and the inversion information of the previous input data signal and to output an AC inversion control signal to decide whether to invert the input data signal on the basis of the AC comparison signal and the inversion information of the previous input data.

3. The circuit of claim 1, wherein the logic high state corresponds to a data '1' state.

4. The circuit of claim 1, further comprising:
    a latch configured to control the number of data signals capable of being input or output simultaneously when a plurality of input data signals are continuously input.

5. The circuit of claim 1, further comprising:
    a latch configured to control at least one of a time point when the input data signal is input and a time point when the output data signal is output from the data converting unit.

6. The circuit of claim 2, wherein:
    the inversion deciding part is configured to decide whether to invert the input data signal so that the changed logic bit number between output data output through the data converting unit is minimized.

7. The circuit of claim 2, wherein the previous input data signal is input immediately before the input data signal is input.

8. The circuit of claim 2, wherein the AC comparison signal has a logic high state when the changed logic bit number is smaller than or equal to the unchanged logic bit number and has a logic low state when the changed logic number is larger than the unchanged logic bit number.

9. The circuit of claim 7, wherein an initial value of the previous input data signal is set so that all of the bit signals have a logic high state.

10. The circuit of claim 8, wherein the inversion information of the previous input data signal has a logic low state when inversion has been performed on the previous input data signal and has a logic high state when inversion has not been performed on the previous input data signal, and an initial value of the inversion information of the previous input data signal corresponds to the logic high state.

11. A data bus inversion circuit for a semiconductor memory device, which selectively inverts, or does not invert, an input data signal including a plurality of serial bit signals on the basis of bit logic states of the bit signals, the circuit comprising:
    a comparison deciding unit configured to define the number of bits of the input data signal having a first logic state and the number of bits of the input data having a second logic state, and to generate a DC inversion control signal on the basis of the number of bits, having a predominant logic state, of the bit signals of the input data signal; and
    a data converting unit configured to invert, or not invert, the input data signal in response to the DC inversion control signal and output the result as an output data signal.

12. The circuit of claim 11, wherein the first logic state corresponds to a data '0' state and the second logic state corresponds to a data '1' state.

13. The circuit of claim 11, wherein the output data signal of the data converting unit is input to an output driver circuit or an output buffer of the semiconductor memory device.

14. The circuit of claim 12, wherein the comparison deciding unit is configured to generate the DC inversion control signal so as not to invert the input data signal when the number of bits of the input data signal having the second logic state is equal to or greater than the half of the total number of bits of the input data signal, and to generate the DC inversion control signal so as to invert the input data signal when the number of bits of the input data signal having the second logic state is less than the half of the total number of bits of the input data signal.

15. The circuit of claim 13, wherein the output driver circuit is an open drain type including a pseudo-open drain type.

16. A data bus inversion method for a semiconductor memory device, which selectively inverts, or does not invert, an input data signal including a plurality of serial bit signals on the basis of bit logic states of the bit signals, the method comprising:
    deciding whether to invert the input data signal on the basis of an AC comparison signal, which represents a variation rate in the bit logic states of the input data signal with respect to a previous input data signal, and inversion information of the previous input data signal; and
    inverting, or not inverting, the input data signal in response to whether to invert the input data signal and outputting the result as an output data signal.

17. The method of claim 16, wherein deciding whether to invert the input data signal comprises:
    comparing the input data signal and the previous input data signal, on a bit-by-bit basis, defining a changed logic bit number and unchanged logic bit number of the input data signal, comparing the changed logic bit number to the unchanged logic bit number, and outputting the comparison result as the AC comparison signal; and
    receiving the AC comparison signal and the inversion information of the previous input data signal and outputting an AC inversion control signal to decide whether to invert the input data signal on the basis of the AC comparison signal and the inversion information of the previous input data.

18. The method of claim 16, wherein receiving the AC comparison signal and the inversion information of the previous input data signal and the outputting of an AC inversion control signal further comprise latching the output data signal to control the number of output data signals capable of being output simultaneously when a plurality of input data signals are continuously input.

19. The method of claim 16, the receiving of the AC comparison signal and the inversion information of the previous input data signal and the outputting of an AC inversion control signal further comprise latching the output data signal to control a time point when the output data signal is output.

20. The method of claim 17, wherein deciding whether to invert the input data signal is performed so that the changed logic bit number between output data is minimized.

21. The method of claim 17, wherein the previous input data signal is input immediately before the input data signal is input.

22. The method of claim 17, wherein the AC comparison signal has a logic high state when the changed logic bit number is smaller than or equal to the unchanged logic bit number and has a logic low state when the changed logic number is larger than the unchanged logic bit number.

23. The method of claim 21, wherein an initial value of the previous input data signal is set so that all of the bit signals have a logic high state.

24. The method of claim 23, wherein the logic high state corresponds to a data '1' state.

25. The method of claim 22, wherein the inversion information of the previous input data signal has a logic low state when inversion has been performed on the previous input data signal and has a logic high state when inversion has not been performed on the previous input data signal, and an initial value of the inversion information of the previous input data signal corresponds to the logic high state.

* * * * *